US012604555B2

(12) United States Patent
Masuda et al.

(10) Patent No.: US 12,604,555 B2
(45) Date of Patent: Apr. 14, 2026

(54) IMAGING DEVICE

(71) Applicant: SONY SEMICONDUCTOR SOLUTIONS CORPORATION, Kanagawa (JP)

(72) Inventors: Yoshiaki Masuda, Kanagawa (JP); Tokihisa Kaneguchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 470 days.

(21) Appl. No.: 18/214,138

(22) Filed: Jun. 26, 2023

(65) Prior Publication Data

US 2023/0335574 A1     Oct. 19, 2023

Related U.S. Application Data

(63) Continuation of application No. 16/972,668, filed as application No. PCT/JP2019/019076 on May 14, 2019, now Pat. No. 11,735,615.

(30) Foreign Application Priority Data

Jun. 15, 2018     (JP) ................................ 2018-114251

(51) Int. Cl.
    *H10F 39/00*     (2025.01)
    *H10F 39/12*     (2025.01)
    *H10F 39/18*     (2025.01)
(52) U.S. Cl.
    CPC ......... *H10F 39/811* (2025.01); *H10F 39/182* (2025.01); *H10F 39/199* (2025.01);
    (Continued)
(58) Field of Classification Search
    CPC .... H10F 39/811; H10F 39/182; H10F 39/199; H10F 39/804; H10F 39/8053;
    (Continued)

(56) References Cited

U.S. PATENT DOCUMENTS 6,624,504 B1     9/2003  Inoue et al.
6,770,547 B1     8/2004  Inoue et al.
(Continued)

FOREIGN PATENT DOCUMENTS

CN          104081526 A      10/2014
JP          2005-109135       4/2005
(Continued)

OTHER PUBLICATIONS

International Search Report and Written Opinion for International (PCT) Patent Application No. PCT/JP2019/019076, dated Aug. 13, 2019, 6 pages.
(Continued)

*Primary Examiner* — Davienne N Monbleau
*Assistant Examiner* — John Patrick Cornely
(74) *Attorney, Agent, or Firm* — SHERIDAN ROSS P.C.

(57)     ABSTRACT

An imaging device including: a photoelectric converter; a protection member provided on a light incidence side of the photoelectric converter; a substrate opposed to the protection member with the photoelectric converter interposed therebetween and having a first surface on the photoelectric converter side and a second surface opposed to the first surface; a rewiring layer provided in a selective region of the second surface of the substrate; and a protective resin layer provided on the second surface of the substrate, the second surface of the substrate having an external terminal coupling region exposed from the protective resin layer, and a stress relaxation region exposed from the protective resin layer and disposed at a position different from the external terminal coupling region.

14 Claims, 23 Drawing Sheets

(52) U.S. Cl.
CPC ....... *H10F 39/804* (2025.01); *H10F 39/8053*
(2025.01); *H10F 39/8063* (2025.01); *H10F*
*39/809* (2025.01)

(58) Field of Classification Search
CPC .. H10F 39/809; H10F 39/802; H10F 39/8063;
H01L 21/768; H01L 23/12; H01L 23/532;
H04N 25/70
See application file for complete search history.

(56) References Cited

U.S. PATENT DOCUMENTS

| | | |
|---|---|---|
| 2002/0041031 A1 | 4/2002 | Sato |
| 2004/0195687 A1 | 10/2004 | Inoue et al. |
| 2004/0245649 A1 | 12/2004 | Imaoka |
| 2015/0380580 A1 | 12/2015 | Miyazaki et al. |
| 2018/0287005 A1 | 10/2018 | Camargo et al. |
| 2021/0005656 A1 | 1/2021 | Shibayama et al. |
| 2021/0249463 A1 | 8/2021 | Masuda et al. |

FOREIGN PATENT DOCUMENTS

| | | |
|---|---|---|
| JP | 2011-071542 | 4/2011 |
| JP | 2016-122758 | 7/2016 |
| WO | WO 2018/061481 | 4/2018 |

OTHER PUBLICATIONS

Official Action for U.S. Appl. No. 16/972,668, dated Oct. 26, 2022,
14 pages.
Notice of Allowance for U.S. Appl. No. 16/972,668, dated Mar. 22,
2023, 7 pages.

IMAGING DEVICE

CROSS REFERENCE TO RELATED APPLICATIONS

This application is a continuation of U.S. patent application Ser. No. 16/972,668, filed Dec. 7, 2020, which is a national stage application under 35 U.S.C. 371 and claims the benefit of PCT Application No. PCT/JP2019/019076, having an international filing date of 14 May 2019, which designated the United States, which PCT application claimed the benefit of Japanese Patent Application No. 2018-114251, filed 15 Jun. 2018, the entire disclosures of each of which are incorporated herein by reference.

TECHNICAL FIELD

The present disclosure relates to an imaging device suitable for a WCSP (Wafer level Chip Size Package) and the like, for example.

BACKGROUND ART

In recent years, an imaging device such as a WCSP has been developed (for example, see PTL 1). This imaging device includes, for example, a protection member that covers a photoelectric converter such as a photodiode (Photo Diode), and a substrate that is opposed to the protection member with the photoelectric converter interposed therebetween.

One surface (a surface opposite to a surface on the photoelectric converter side) of the substrate is provided with a rewiring layer and a terminal for external coupling. The rewiring layer is covered with a protective resin layer.

CITATION LIST

Patent Literature

[PTL 1] Japanese Unexamined Patent Application Publication No. 2012-191055

SUMMARY OF THE INVENTION

In such an imaging device, it is desired to suppress deformation of a substrate.

It is therefore desirable to provide an imaging device that is able to suppress deformation of a substrate.

An imaging device according to an embodiment of the present disclosure includes: a photoelectric converter; a protection member provided on a light incidence side of the photoelectric converter; a substrate opposed to the protection member with the photoelectric converter interposed therebetween and having a first surface on the photoelectric converter side and a second surface opposed to the first surface; a rewiring layer provided in a selective region of the second surface of the substrate; and a protective resin layer provided on the second surface of the substrate, the second surface of the substrate having an external terminal coupling region exposed from the protective resin layer, and a stress relaxation region exposed from the protective resin layer and disposed at a position different from the external terminal coupling region.

In the imaging device according to the embodiment of the present disclosure, the second surface of the substrate has the stress relaxation region exposed from the protective resin layer, which reduces stress applied to the substrate due to the protective resin layer.

According to the imaging device according to the embodiment of the present disclosure, the second surface of the substrate has the stress relaxation region exposed from the protective resin layer, which makes it possible to reduce stress applied to the substrate. This consequently makes it possible to suppress deformation of the substrate.

It is to be noted that the above-described contents are mere examples of the present disclosure. The effects of the present disclosure are not limited to the description above, and the effects of the present disclosure may be other effects, or may further include other effects.

BRIEF DESCRIPTION OF DRAWINGS

FIG. 16 is a functional block diagram illustrating an example of an electronic apparatus including the imaging device illustrated in FIG. 1 or the like.

MODES FOR CARRYING OUT THE INVENTION

In the following, some embodiments of the present disclosure are described in detail with reference to drawings. It is to be noted that description is given in the following order.
1. Embodiment (an imaging device having a stress relaxation region in a second surface of a substrate)
2. Modification Example 1 (an example in which a narrow pitch region also has the stress relaxation region)
3. Modification Example 2 (an example in which a protective resin layer is provided to surround a solder ball)
4. Modification Example 3 (an example in which the stress relaxation region is provided at a position not overlapping a rewiring layer)
5. Modification Example 4 (an example including one chip)
6. Modification Example 5 (an example including three chips)
7. Application Example (an electronic apparatus)
8. Practical Application Examples

1. Embodiment (Functional Configuration of Imaging Device 1)

Figure 1:
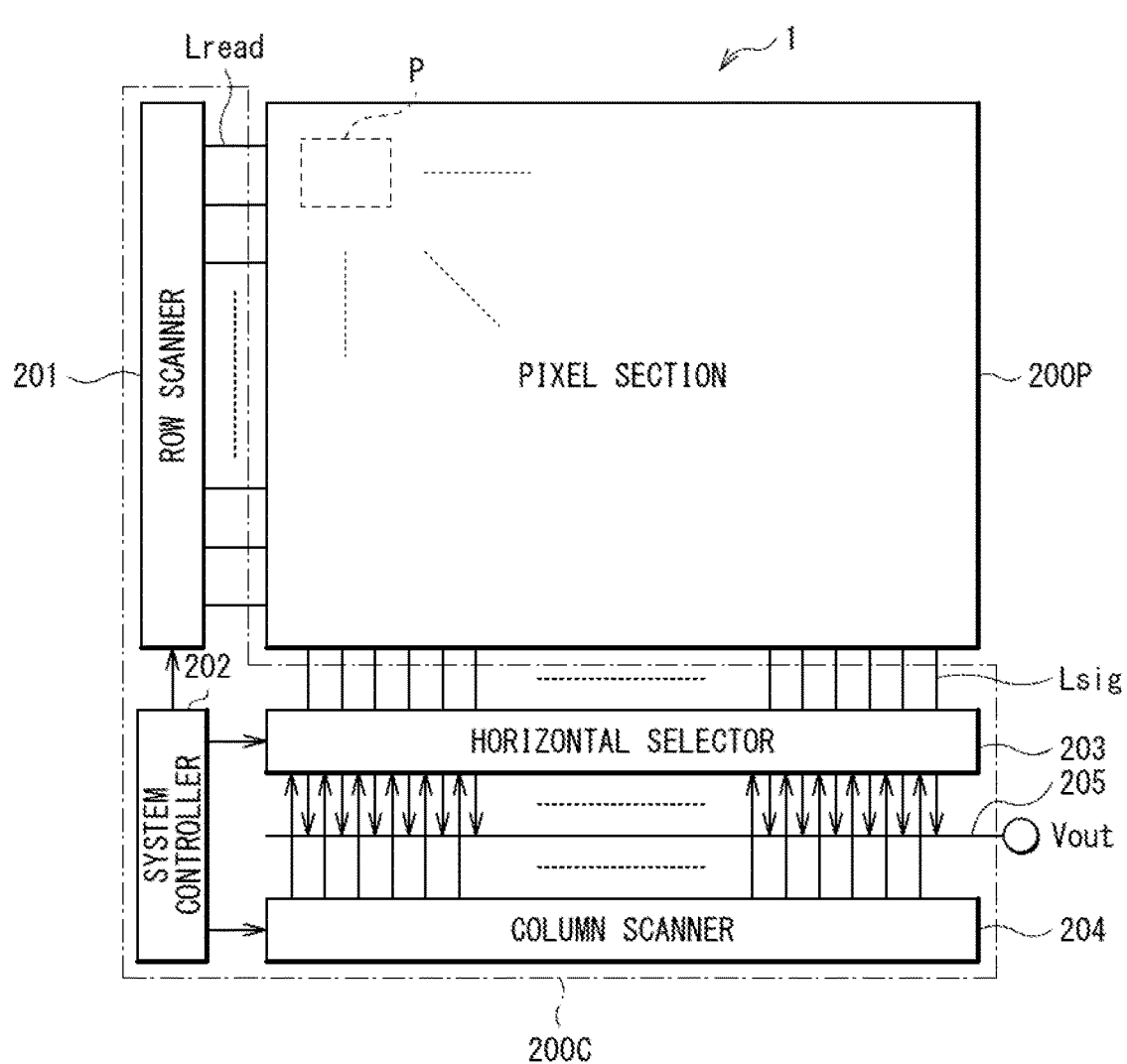
FIG. 1 is a block diagram illustrating an example of a functional configuration of an imaging device according to an embodiment of the present disclosure.

FIG. 1 schematically illustrates an example of a functional configuration of an imaging device (an imaging device 1) according to an embodiment of the present disclosure. The imaging device 1 includes a pixel section 200P and a circuit section 200C for driving the pixel section 200P. The pixel section 200P includes a plurality of light reception unit regions (pixels P) that are two-dimensionally arranged. The circuit section 200C includes, for example, a row scanner 201, a horizontal selector 203, a column scanner 204, and a system controller 202.

For example, a pixel drive line Lread (for example, a row selection line and a reset control line) is wired with each pixel row, and a vertical signal line Lsig is wired with each pixel column. The pixel drive line Lread transmits a drive signal for signal reading from the pixel section 200P. One end of the pixel drive line Lread is coupled to an output terminal, corresponding to each row, of the row scanner 201. The pixel section 200P includes, for example, a pixel circuit provided for each of the pixels P.

The row scanner 201 is a pixel driver that includes a shift register, an address decoder, and the like, and drives each of the pixels P of the pixel section 200P, for example, on a row-by-row basis. A signal outputted from each of the pixels P of a pixel row selected and scanned by the row scanner 201 is supplied to the horizontal selector 203 through each of the vertical signal lines Lsig. The horizontal selector 203 includes an amplifier, a horizontal selection switch, and the like that are provided for each of the vertical signal lines Lsig.

The column scanner 204 includes a shift register, an address decoder, and the like, and sequentially drives respective horizontal selection switches of the horizontal selector 203 while scanning the horizontal selection switches. Through such selective scanning by the column scanner 204, signals of respective pixels P transmitted through the respective vertical signal lines Lsig are sequentially outputted to a horizontal signal line 205, and are inputted to an unillustrated signal processor or the like through the horizontal signal line 205.

The system controller 202 receives a clock given from the outside, data instructing an operation mode, and the like, and outputs data such as internal information of the imaging device 1. The system controller 202 further includes a timing generator that generates various timing signals, and performs drive control of the row scanner 201, the horizontal selector 203, the column scanner 204, and the like on the basis of the various timing signals generated by the timing generator.

(Main Part Configuration of Imaging Device 1)

Figure 2:
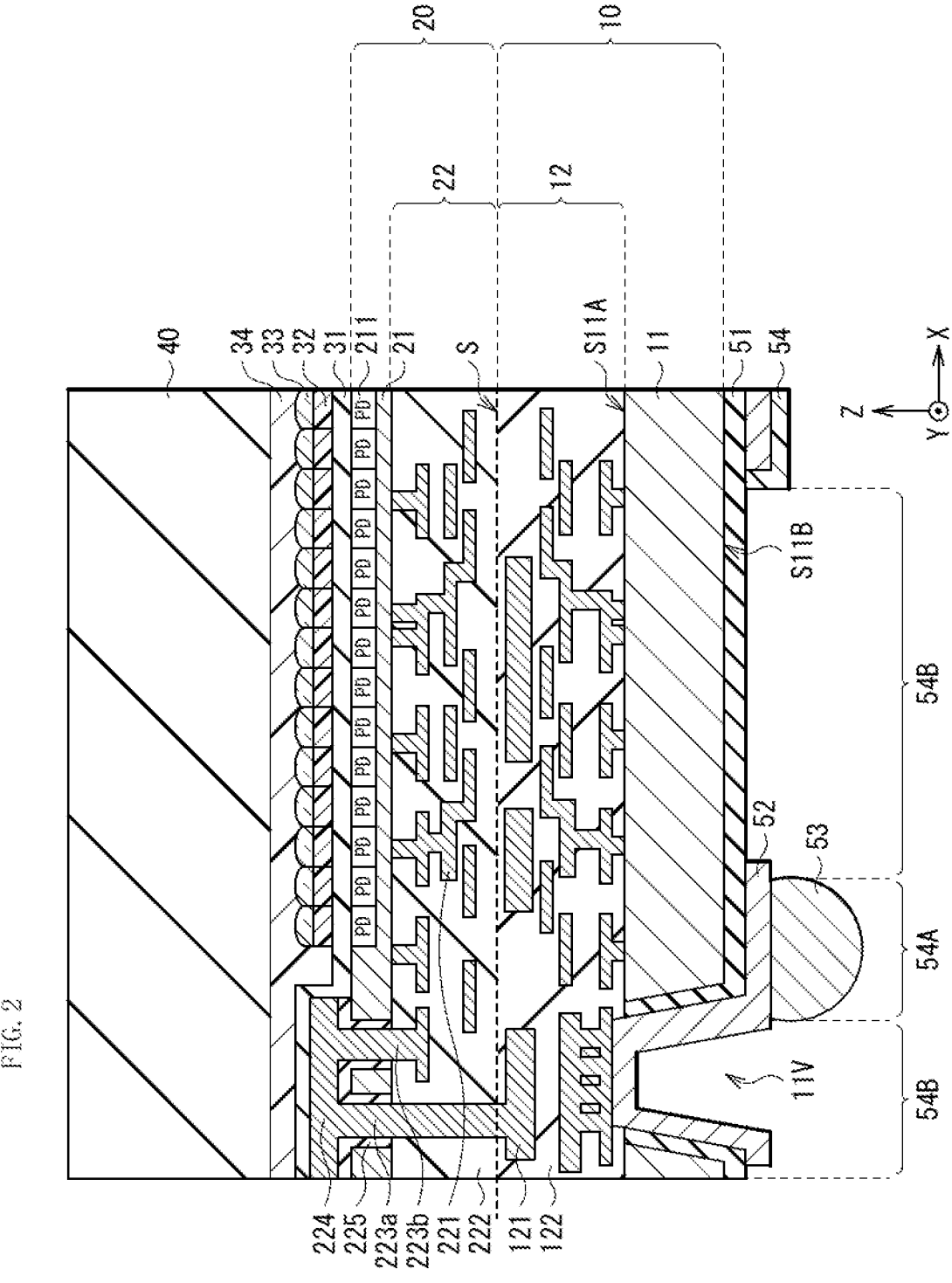
FIG. 2 is a schematic view of a cross-sectional configuration of a main part of the imaging device illustrated in FIG. 1.

FIG. 2 is a schematic cross-sectional view of a configuration of a main part of the imaging device 1. A specific configuration of the imaging device 1 is described with use of FIG. 2.

The imaging device 1 is a WCSP, and includes, for example, a logic chip 10 (a second chip), a sensor chip 20 (a first chip), and a protection member 40 in this order. A planarization film 31, a color filter 32, an on-chip lens 33, and a sealing resin 34 are provided in this order from the sensor chip 20 side between the sensor chip 20 and the protection member 40. The imaging device 1 is configured to mount the logic chip 10 side onto a printed board such as a mother board, and includes an insulating film 51, a rewiring layer 52, a solder ball 53, and a protective resin layer 54 on the logic chip 10 side.

The logic chip 10 includes, for example, a semiconductor substrate 11 and a multilayer wiring layer 12, and has a stacked configuration of these components. The logic chip 10 includes, for example, a logic circuit and a control circuit. The entirety of the circuit section 200C (FIG. 1) may be provided in the logic chip 10. Alternatively, a portion of the circuit section 200C may be provided in the sensor chip 20, and the remaining portion of the circuit section 200C may be provided in the logic chip 10.

The semiconductor substrate 11 is opposed to the protection member 40 with the multilayer wiring layer 12 and the sensor chip 20 interposed therebetween. The semiconductor substrate 11 has a first surface S11A on the sensor chip 20 side and a second surface S11B opposed to the first surface S11A. The multilayer wiring layer 12 is provided on the first surface S11A of the semiconductor substrate 11, and the insulating film 51 is provided on the second surface S11B of the semiconductor substrate 11. The semiconductor substrate 11 includes, for example, a silicon (Si) substrate. Here, the semiconductor substrate 11 corresponds to a specific example of a "substrate" in the present disclosure.

The multilayer wiring layer 12 is provided between the semiconductor substrate 11 and the sensor chip 20. The multilayer wiring layer 12 includes a plurality of wiring lines 121 and an interlayer insulating film 122 that separates the plurality of wiring lines 121. The wiring lines 121 include, for example, copper (Cu), aluminum (Al), tungsten (W), or the like. The interlayer insulating film 122 includes, for example, a silicon oxide film (SiO), a silicon nitride film (SiN), or the like.

A through hole 11V is provided at a predetermined position of the semiconductor substrate 11. The through hole 11V penetrates from the second surface S11B to the first surface S11A of the semiconductor substrate 11, and reaches the wiring line 121 of the multilayer wiring layer 12 or a pad electrode.

The insulating film 51 covers a side wall of the through hole 11V from the second surface S11B of the semiconductor substrate 11. The insulating film 51 includes, for example, a silicon oxide film (SiO), a silicon nitride film (SiN), or the like.

The rewiring layer 52 covers the side wall of the through hole 11V with the insulating film 51 interposed therebetween, and covers a bottom surface of the through hole 11V. On the bottom surface of the through hole 11V, the rewiring layer 52 is in contact with the wiring line 121 of the multilayer wiring layer 12 or the pad electrode. The rewiring layer 52 extends from the through hole 11V to the second surface S11B of the semiconductor substrate 11, and is drawn to a formation region of the solder ball 53. On the second surface S11B of the semiconductor substrate 11, the rewiring layer 52 is disposed in a selective region of the second surface S11B with the insulating film 51 interposed therebetween. The rewiring layer 52 includes, for example, copper (Cu), tungsten (W), titanium (Ti), tantalum (Ta), a titanium tungsten alloy (TiW), a polysilicon, or the like.

Figure 3:
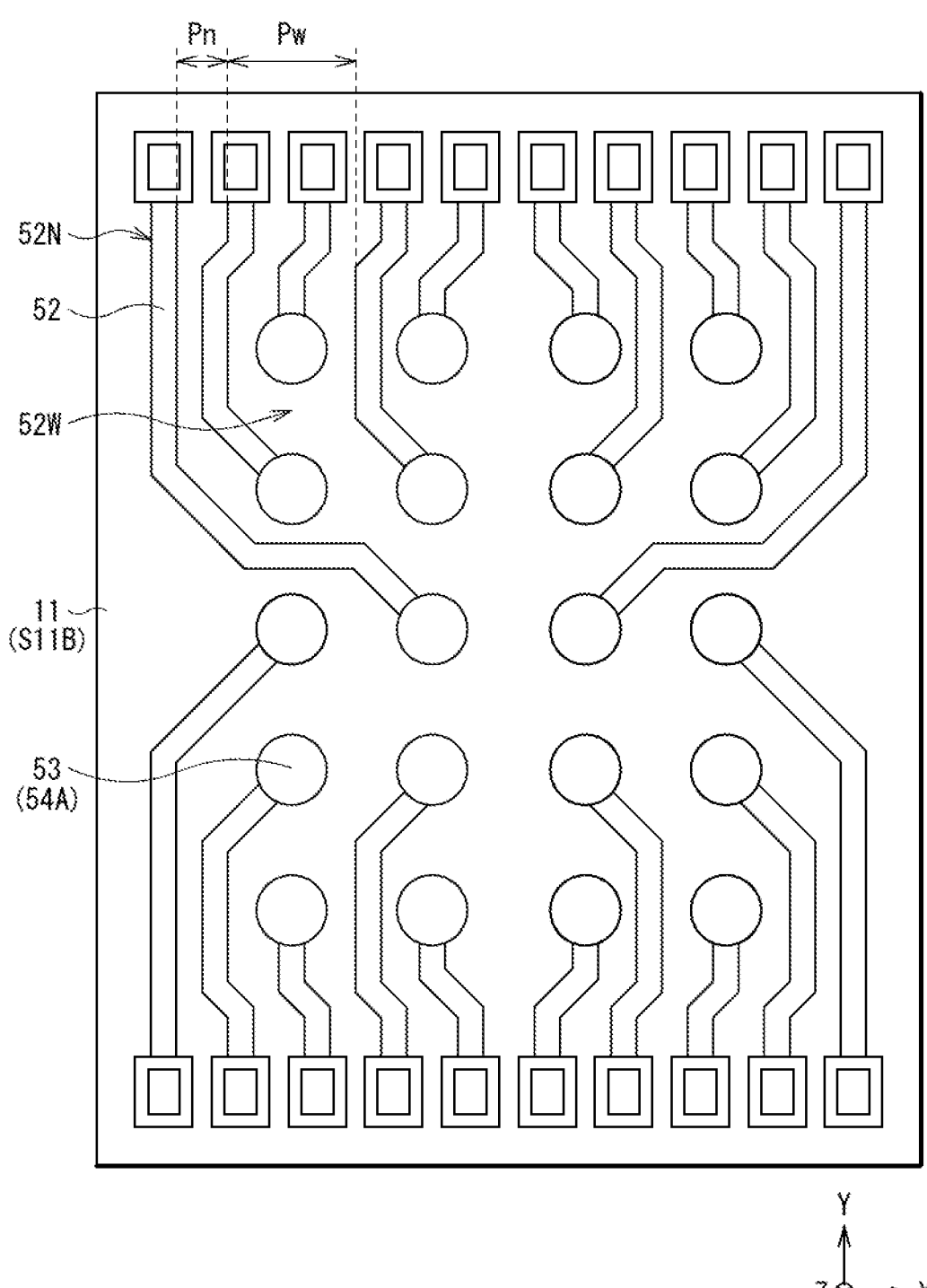
FIG. 3 is a schematic plan view of an example of configurations of a rewiring layer and a solder ball illustrated in FIG. 2.

FIG. 3 illustrates an example of a planar configuration of the rewiring layer 52 together with the solder ball 53. A plurality of rewiring layers 52 extending in directions substantially parallel to each other (a Y direction in FIG. 3) is provided on the second surface S11B of the semiconductor substrate 11. The second surface S11B of the semiconductor substrate 11 has, for example, a narrow pitch region 52N and a wide pitch region 52W. In the narrow pitch region 52N, the rewiring layers 52 adjacent to each other are disposed at a predetermined interval (a pitch $P_n$). In the wide pitch region 52W, the rewiring layers 52 adjacent to each other are disposed at an interval (a pitch $P_w$) wider than the pitch $P_n$ in the narrow pitch region 52N. A width (a size in an X direction in FIG. 3) of the rewiring layer 52 is, for example, 20 μm to 40 μm, the pitch $P_n$ is 20 μm to 40 μm, and the pitch $P_w$ is 100 μm to 200 μm.

The solder ball 53 is coupled to the rewiring layer 52 drawn onto the second surface S11B of the semiconductor substrate 11 (FIG. 2). The solder ball 53 functions as an external coupling terminal for mounting onto a printed board, and includes, for example, a high melting point lead-free solder such as Sn—Ag—Cu, or the like. For example, a plurality of solder balls 53 is provided on the second surface S11B of the semiconductor substrate 11 to be regularly arranged at a predetermined pitch. The arrangement of the solder balls 53 is appropriately set in accordance with a position of a bonding pad on a mounted printed board (not illustrated) side. The solder ball 53 is electrically coupled to the wiring line 121 of the multilayer wiring layer 12 or the pad electrode via the rewiring layer 52. Here, the solder ball 53 corresponds to a specific example of an "external terminal" in the present disclosure.

The protective resin layer 54 provided on the second surface S11B of the semiconductor substrate 11 protects the rewiring layer 52. The protective resin layer 54 is not provided in a region in which the solder ball 53 is provided of the second surface S11B of the semiconductor substrate 11. That is, the solder ball 53 is coupled to a portion, exposed from the protective resin layer 54, of the rewiring layer 52. In other words, the second surface S11B of the semiconductor substrate 11 has an external terminal coupling region 54A that causes the rewiring layer 52 to be exposed from the protective resin layer 54, and the solder ball 53 is coupled to the rewiring layer 52 in the external terminal coupling region 54A. The protective resin layer 54 includes, for example, a solder resist, and includes an epoxy-based, polyimide-based, silicon-based, or acrylic-based resin, and the like.

In the present embodiment, the second surface S11B of the semiconductor substrate 11 has a stress relaxation region 54B in addition to the external terminal coupling region 54A. The stress relaxation region 54B is a region, exposed from the protective resin layer 54, of the second surface S11B of the semiconductor substrate 11, and is disposed at a position not overlapping the external terminal coupling region 54A in plan (an XY plane in FIG. 2) view. In the stress relaxation region 54B, for example, the protective resin layer 54 is not provided, and the rewiring layer 52 or the insulating film 51 is exposed. As described in detail later, providing such a stress relaxation region 54B in the second surface S11B of the semiconductor substrate 11 makes it possible to reduce stress applied to the semiconductor substrate 11.

Figure 4:
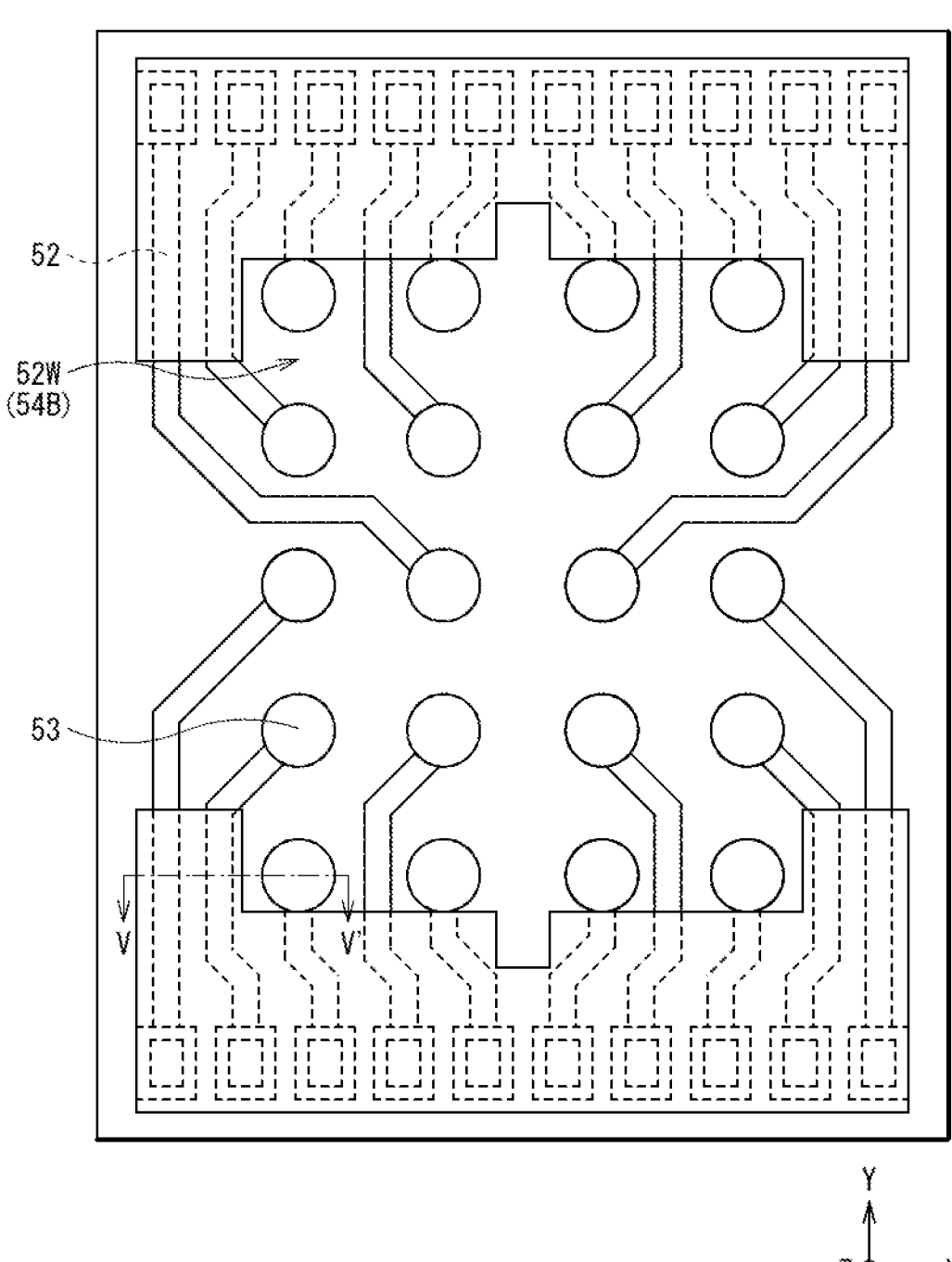
FIG. 4 is a schematic plan view of a configuration of a protective resin layer illustrated in FIG. 2 together with the rewiring layer and the solder ball.
Figure 5:
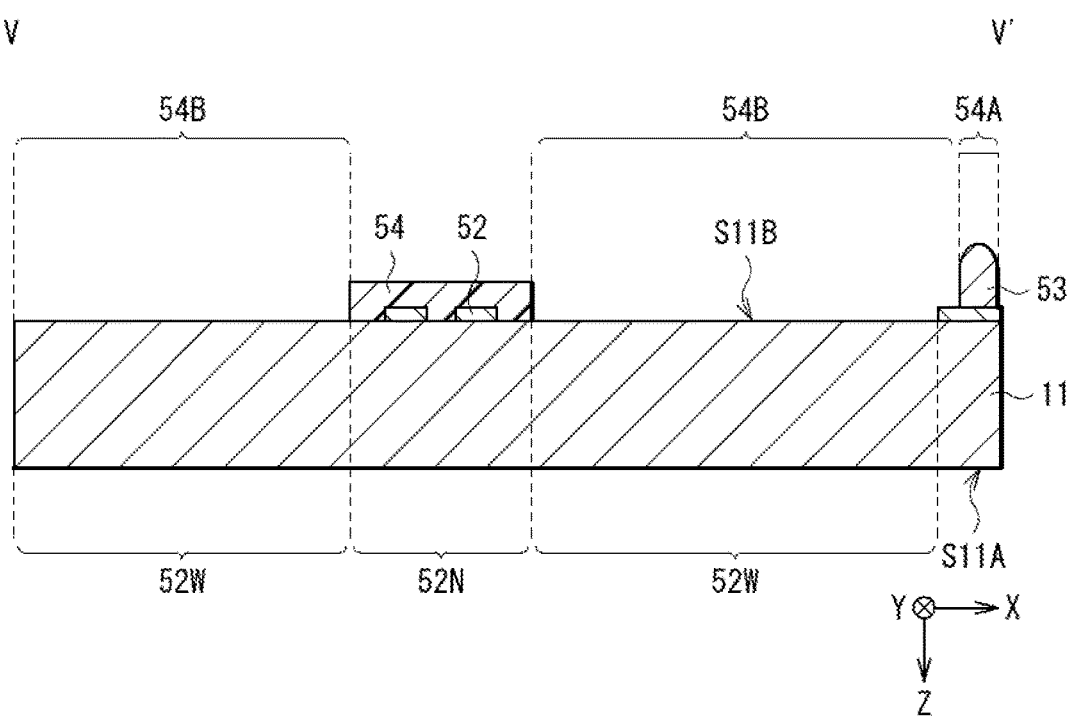
FIG. 5 is a schematic view of a cross section taken along a line V-V illustrated in FIG. 4.

FIGS. 4 and 5 illustrate an example of the position of the stress relaxation region 54B. FIG. 4 illustrates an example of planar configurations of the rewiring layer 52, the solder ball 53, and the protective resin layer 54, and FIG. 5 illustrates a cross-sectional configuration taken along a line V-V' illustrated in FIG. 4. As illustrated, the protective resin layer 54 may be provided at a position overlapping the narrow pitch region 52N in plan view, and the stress relaxation region 54B may be disposed at a position overlapping the wide pitch region 52W. In the narrow pitch region 52N, migration (corrosion) easily occurs due to the rewiring layer 52. Selectively providing the protective resin layer 54 in the narrow pitch region 52N makes it possible to suppress occurrence of migration.

The sensor chip 20 provided between the logic chip 10 and the protection member 40 includes, for example, a multilayer wiring layer 22 and a semiconductor substrate 21 in this order from the logic chip 10 side.

The multilayer wiring layer 22 of the sensor chip 20 is in contact with the multilayer wiring layer 12 of the logic chip 10, and a bonded surface S between the sensor chip 20 and the logic chip 10 is provided between the multilayer wiring layer 22 and the multilayer wiring layer 12. The multilayer wiring layer 22 includes a plurality of wiring lines 221 and an interlayer insulating film 222 that separates the plurality of wiring lines 221. The plurality of wiring lines 221 is included in a pixel circuit of the pixel section 200P (FIG. 1). The wiring lines 221 include, for example, copper (Cu), aluminum (Al), tungsten (W), or the like. The interlayer insulating film 222 includes, for example, a silicon oxide film (SiO), a silicon nitride film (SiN), or the like.

The semiconductor substrate 21 provided between the multilayer wiring layer 22 and the planarization film 31 includes, for example, a silicon (Si) substrate. A photodiode (PD) 211 is provided for each of the pixels P in the semiconductor substrate 21 of the sensor chip 20. The PD 211 is provided in proximity to a light reception surface (a surface opposite to a surface on the multilayer wiring layer 22 side) of the semiconductor substrate 21. Here, the PD 211 corresponds to a specific example of a "photoelectric converter" in the present disclosure.

Through electrodes 223a and 223b are provided in the sensor chip 20. The through electrodes 223a and 223b are coupled to each other via a coupling wiring line 224 provided between the semiconductor substrate 21 and the planarization film 31. The coupling wiring line 224 is disposed at a position not overlapping the PD 211 in plan view. The through electrode 223a penetrates through the semiconductor substrate 21 and the multilayer wiring layer 22 to be coupled to the wiring line 121 of the logic chip 10. The through electrode 223b penetrates through the semiconductor substrate 11 to be coupled to the wiring line 221 of the sensor chip 20. That is, the multilayer wiring layer 22 of the sensor chip 20 is electrically coupled to the multilayer wiring layer 12 of the logic chip 10 via the through electrodes 223a and 223b and the coupling wiring line 224. An insulating film 225 is provided between each of the through electrodes 223a and 223b and the semiconductor substrate 21.

The planarization film 31 provided between the semiconductor substrate 21 and the color filter 32 planarizes the light reception surface of the semiconductor substrate 21. The planarization film 31 includes, for example, silicon oxide (SiO) and the like.

The color filter 32 provided on the light reception surface of the sensor chip 20 is, for example, one of a red (R) filter, a green (G) filter, a blue (B) filter, and a white filter (W), and is provided for each of the pixels P, for example. These color filters 32 are provided in a regular color arrangement (for example, a Bayer arrangement). Providing such color filters 32 allows the imaging device 1 to acquire color light reception data corresponding to the color arrangement.

The on-chip lens 33 on the color filter 32 is provided for each of the pixels P at a position opposed to the PD 211 of the sensor chip 20. Light having entered the on-chip lens 33 is concentrated on the PD 211 in each of the pixels P. A lens system of the on-chip lens 33 is set at a value corresponding to a size of the pixel P. Examples of lens materials of the on-chip lens 33 include an organic material, a silicon oxide film (SiO), and the like.

The protection member 40 covering the sensor chip 20 with the on-chip lens 33 interposed therebetween has a thickness that is sufficiently larger than thicknesses of the logic chip 10 and the sensor chip 20. The protection member 40 includes, for example, a glass substrate. For example, an IR (infrared) cut filter or the like may be provided on a surface (a surface opposite to a surface on the sensor chip 20 side) of the protection member 40 provided on a light incidence side of the sensor chip 20. The protection member 40 is opposed to the logic chip 10 with the sensor chip 20 interposed therebetween.

The sealing resin 34 provided between the protection member 40 and the on-chip lens 33 has, for example, a refractive index substantially equal to a refractive index of the protection member 40. The sealing resin 34 is provided to fill a space between the protection member 40 and the sensor chip 20. The protection member 40 and the sensor chip 20 are adhered to each other at edges thereof. The imaging device 1 may have a cavity structure having an airtight space between the protection member 40 and the sensor chip 20.

(Workings and Effects of Imaging Device 1)

In the imaging device 1, the wiring line 121 or the pad electrode provided in the multilayer wiring layer 12 of the logic chip 10 is drawn to the second surface S11B of the semiconductor substrate 11 by the rewiring layer 52 provided in the through hole 11V. This causes inputting and outputting of signals between the outside from the second surface S11B side of the semiconductor substrate 11 and the sensor chip 20. In such an imaging device 1, an opening section for pad electrode coupling on the light reception surface side of the sensor chip 20 is not necessary, which makes it possible to reduce a chip size.

In addition, in the imaging device 1, the sensor chip 20 and the logic chip 10 are stacked, which makes it possible to reduce the size of the imaging device 1, as compared with a case where the pixel section 200P and the circuit section 200C are provided in one semiconductor substrate.

In particular, in the imaging device 1 according to the present embodiment, the second surface S11B of the semiconductor substrate 11 has the stress relaxation region 54B exposed from the protective resin layer 54, which reduces stress applied to the semiconductor substrate 11 due to the protective resin layer 54. This makes it possible to suppress deformation of the semiconductor substrate 11. The workings and the effects are described below with use of a comparative example.

Figure 6A:
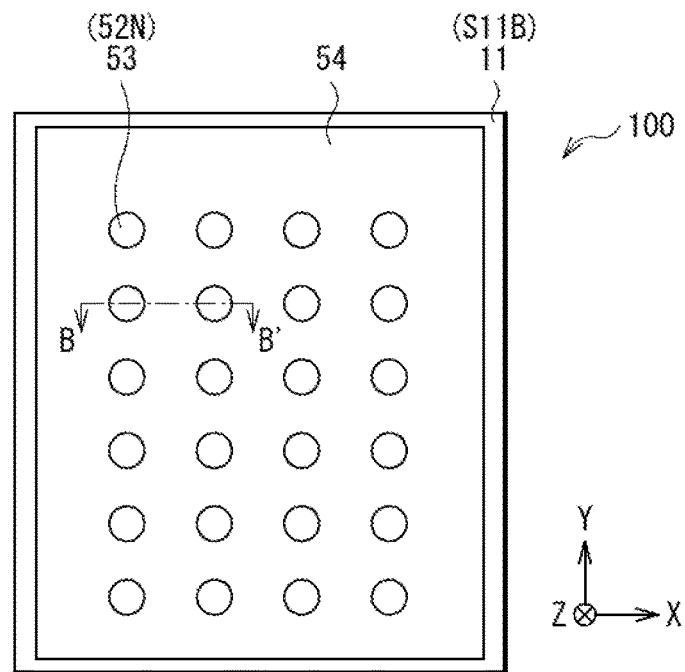
FIG. 6A is a schematic plan view of a configuration of a main part of an imaging device according to a comparative example.
Figure 6B:
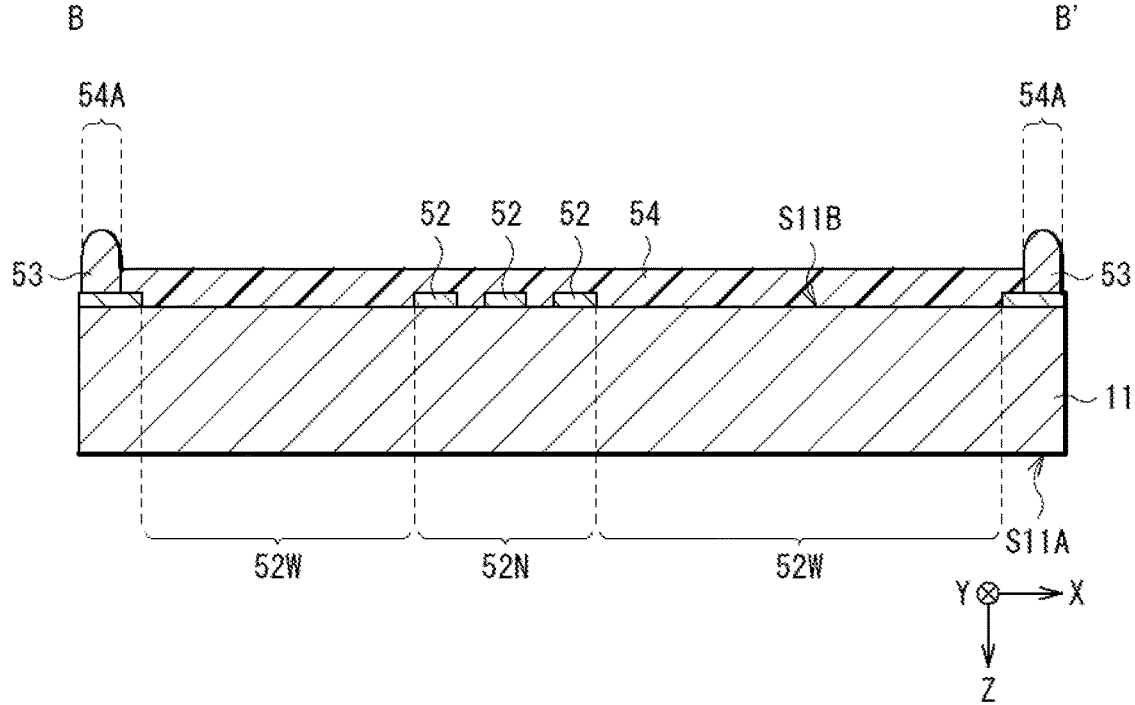
FIG. 6B is a schematic view of a cross-sectional configuration taken along a line B-B' illustrated in FIG. 6A.

FIGS. 6A and 6B schematically illustrate a configuration of a main part of an imaging device (an imaging device 100) according to a comparative example. FIG. 6A illustrates a planar configuration on the second surface S11B side of the semiconductor substrate 11, and FIG. 6B illustrates a cross-sectional configuration taken along a line B-B' illustrated in FIG. 6A. The imaging device 100 includes the rewiring layer 52, the solder ball 53, and the protective resin layer 54 on the second surface S11B of the semiconductor substrate 11, as with the imaging device 1.

In the imaging device 100, of the second surface S11B of the semiconductor substrate 11, only a region provided with the solder ball 53 is exposed from the protective resin layer 54, and a region other than the region is covered with the protective resin layer 54. In other words, in the imaging device 100, the second surface S11B of the semiconductor substrate 11 has only the external terminal coupling region 54A, and does not have a stress relaxation region (the stress relaxation region 54B in FIG. 2).

Figure 7:
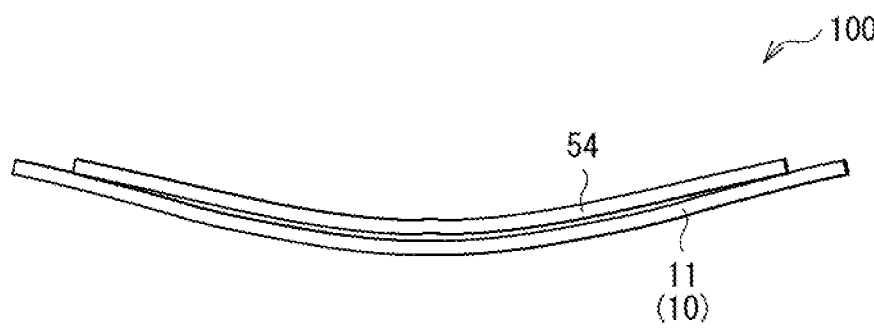
FIG. 7 is a schematic cross-sectional view for describing an issue of the imaging device illustrated in FIG. 6A.

In such an imaging device 100, for example, during a manufacturing process, there is a possibility that the semiconductor substrate 11 is greatly warped, as illustrated in FIG. 7. This is caused by application of stress to the semiconductor substrate 11 due to a difference between the thermal expansion coefficient of the protective resin layer 54 and the thermal expansion coefficient of the semiconductor substrate 11. The larger the area of the protective resin layer 54 provided on the second surface S11B of the semiconductor substrate 11 is, the larger the stress applied to the semiconductor substrate 11 becomes. Accordingly, in the imaging device 100 in which the protective resin layer 54 is provided on the substantially entire second surface S11B of the semiconductor substrate 11, large stress is applied to the semiconductor substrate 11 due to the protective resin layer 54. In a case where the semiconductor substrate 11 is deformed, handling in the manufacturing process becomes difficult. In addition, there is a possibility that reliability is reduced.

In contrast, in the imaging device 1 according to the present embodiment, the second surface S11B of the semiconductor substrate 11 has the stress relaxation region 54B in addition to the external terminal coupling region 54A. In the stress relaxation region 54B, the second surface S11B of the semiconductor substrate 11 is exposed from the protective resin layer 54. Accordingly, in the imaging device 1, as compared with the imaging device 100, the area of the protective resin layer 54 provided on the second surface S11B of the semiconductor substrate 11 becomes small, and stress applied to the semiconductor substrate 11 due to the protective resin layer 54 is reduced. This makes it possible to suppress deformation of the semiconductor substrate 11. Thus, handling in the manufacturing process becomes easy, and it is also possible to suppress reduction in reliability.

As described above, in the imaging device 1 according to the present embodiment, the second surface S11B of the semiconductor substrate 11 has the stress relaxation region 54B exposed from the protective resin layer 54, which makes it possible to reduce stress applied to the semiconductor substrate 11. This makes it possible to suppress deformation of the semiconductor substrate 11.

In addition, for example, the stress relaxation region 54B is disposed at a position overlapping the wide pitch region 52W, and the protective resin layer 54 is provided in the narrow pitch region 52N. This makes it possible to protect the rewiring layers 52 in the narrow pitch region by the protective resin layer 54 while reducing stress applied to the semiconductor substrate 11. This consequently makes it possible to reduce deformation of the semiconductor substrate 11 and suppress occurrence of migration of the rewiring layers 52.

Modification examples of the above-described embodiment are described below, and the same components as those in the above-described embodiment are denoted by the same reference numerals, and description thereof is omitted as appropriate.

Modification Example 1

Figure 8A:
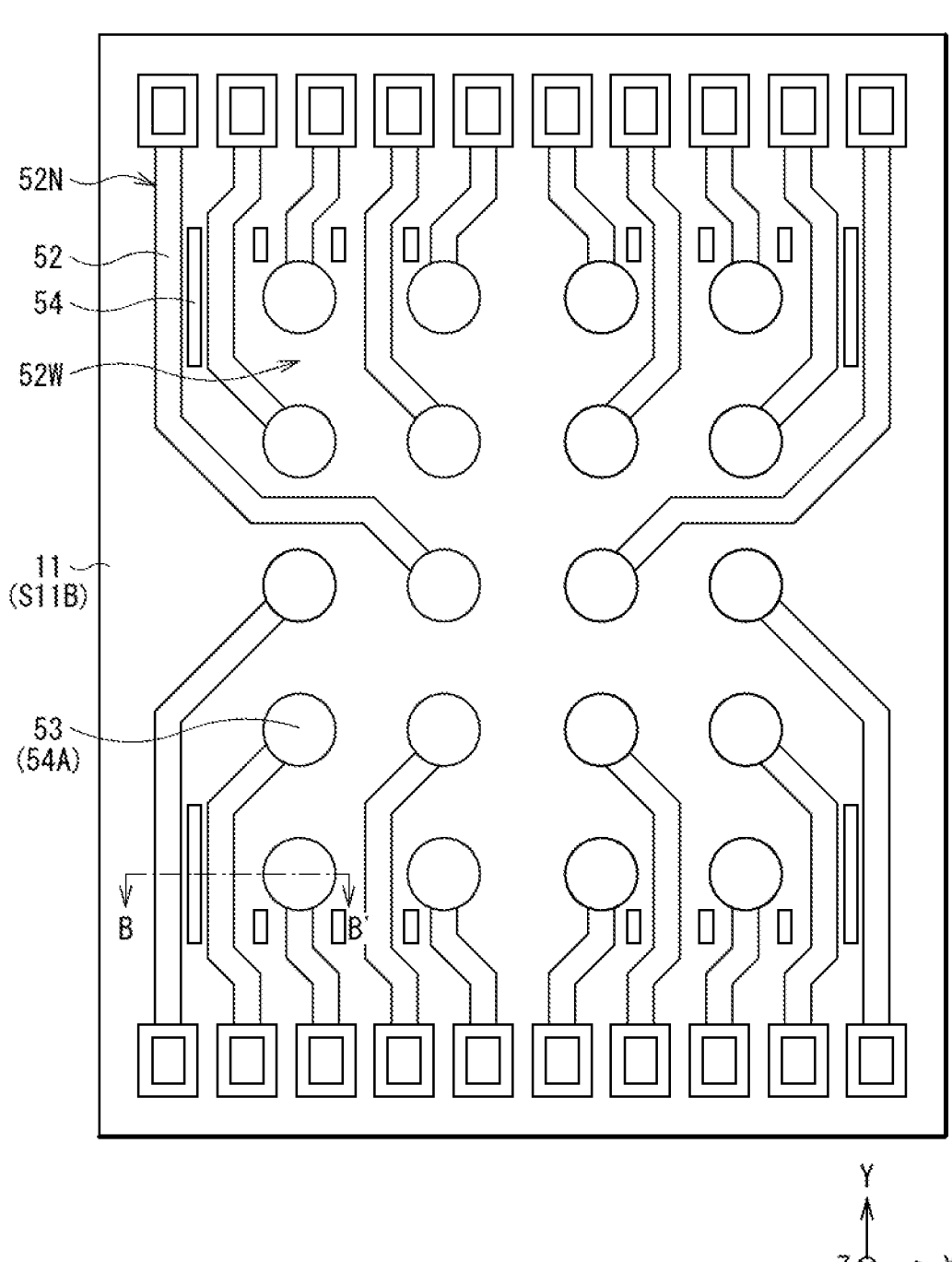
FIG. 8A is a schematic plan view of a configuration of a main part of an imaging device according to a modification example 1.
Figure 8B:
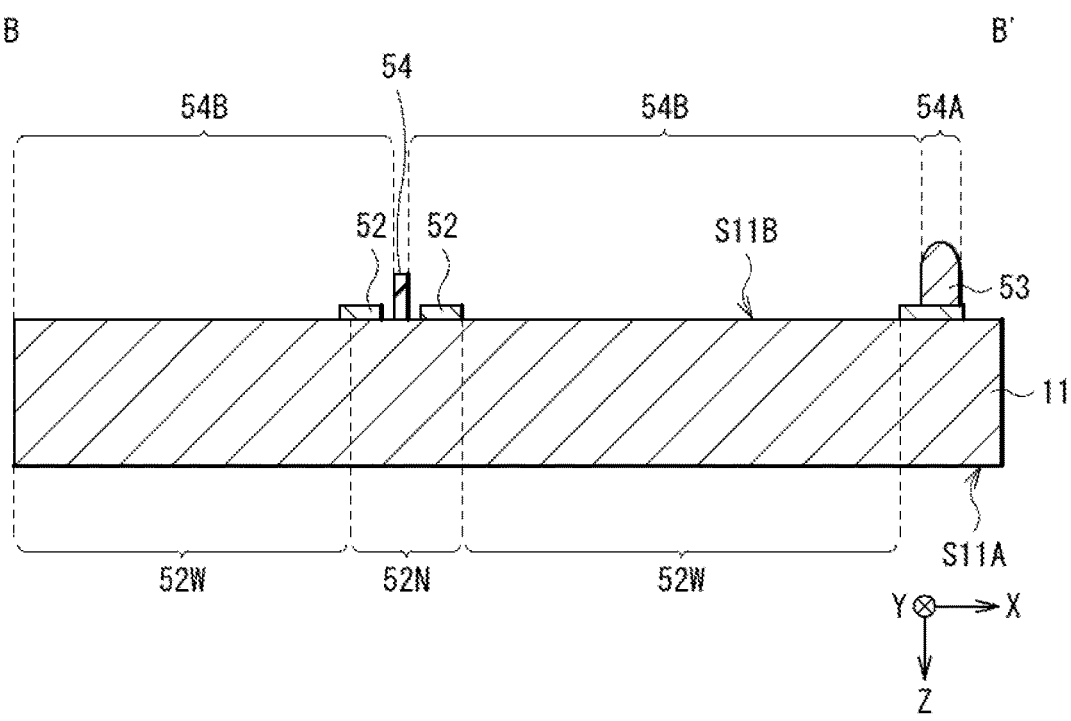
FIG. 8B is a schematic view of a cross-sectional configuration taken along a line B-B' illustrated in FIG. 8A.

FIGS. 8A and 8B illustrate a configuration of a main part of the imaging device 1 according to a modification example 1 of the above-described embodiment. FIG. 8A illustrates planar configurations of the semiconductor substrate 11 (the second surface S11B), the rewiring layer 52, the solder ball 53, and the protective resin layer 54, and FIG. 8B illustrates a cross-sectional configuration taken along a line B-B' illustrated in FIG. 8A. Here, the protective resin layer 54 is provided between the rewiring layers 52 adjacent to each other in the narrow pitch region 52N. That is, the stress relaxation region 54B is provided also at a position overlapping the narrow pitch region 52N in plan view. Except for this point, the imaging device 1 according to the modification example 1 has a configuration similar to that of the imaging device 1 according to the above-described embodiment, and the workings and effects thereof are also similar.

The protective resin layer 54 has a rectangular planar shape, and is provided at a position not overlapping the rewiring layer 52 in plan view. For example, a plurality of rectangular protective resin layers 54 is disposed in stripes on the second surface S11B of the semiconductor substrate 11. A width of each of the protective resin layers 54 (a size in the X direction in FIGS. 8A and 8B) is smaller than the pitch $P_n$ of the narrow pitch region 52N, and is, for example, 20 μm to 40 μm.

The stress relaxation region 54B is provided at a position overlapping the rewiring layer 52 in plan view in the narrow pitch region 52N. Thus, the stress relaxation region 54B may be provided at a position overlapping a portion of the narrow pitch region 52N in addition to the position overlapping the wide pitch region 52W.

Modification Example 2

Figure 9A:
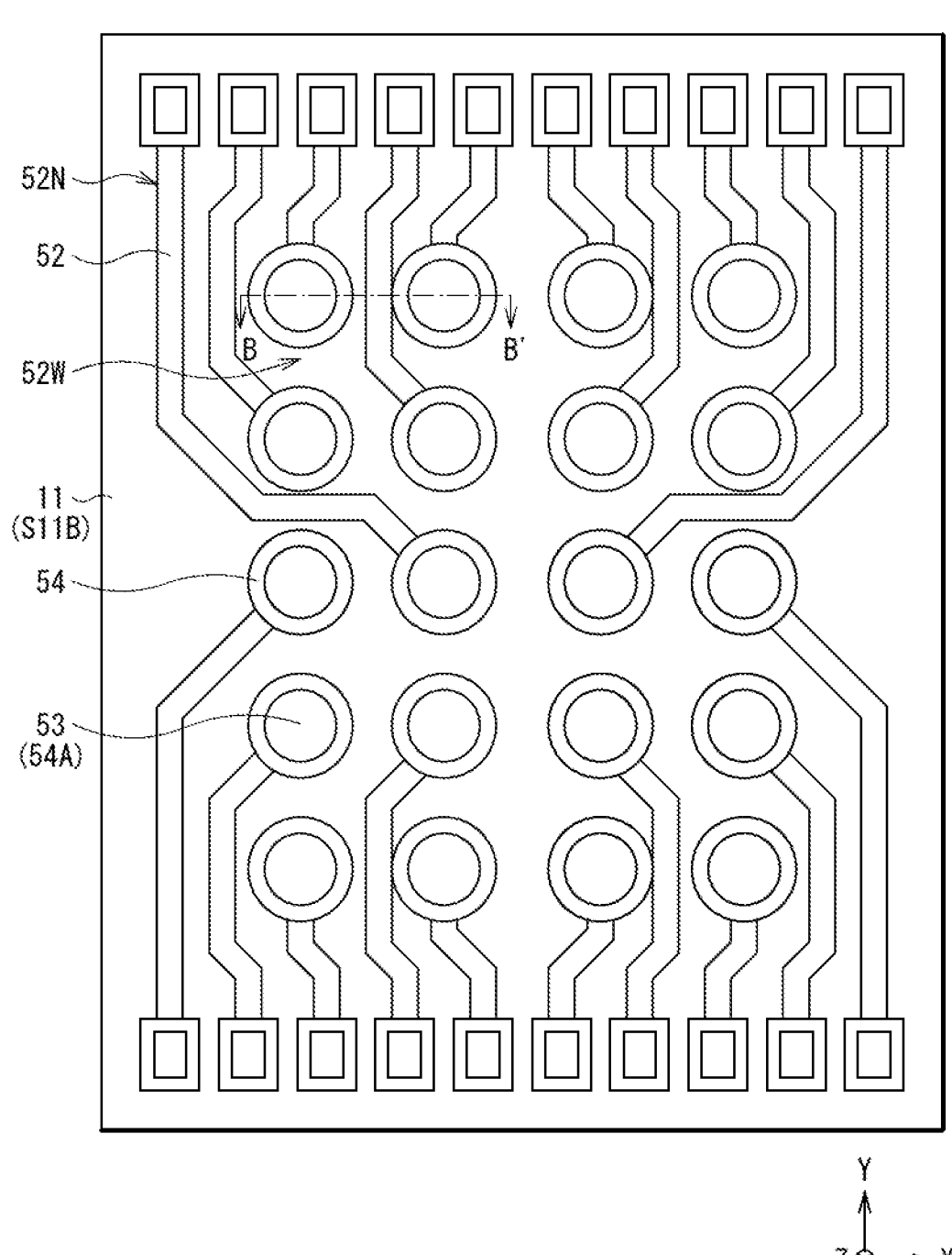
FIG. 9A is a schematic plan view of a configuration of a main part of an imaging device according to a modification example 2.
Figure 9B:
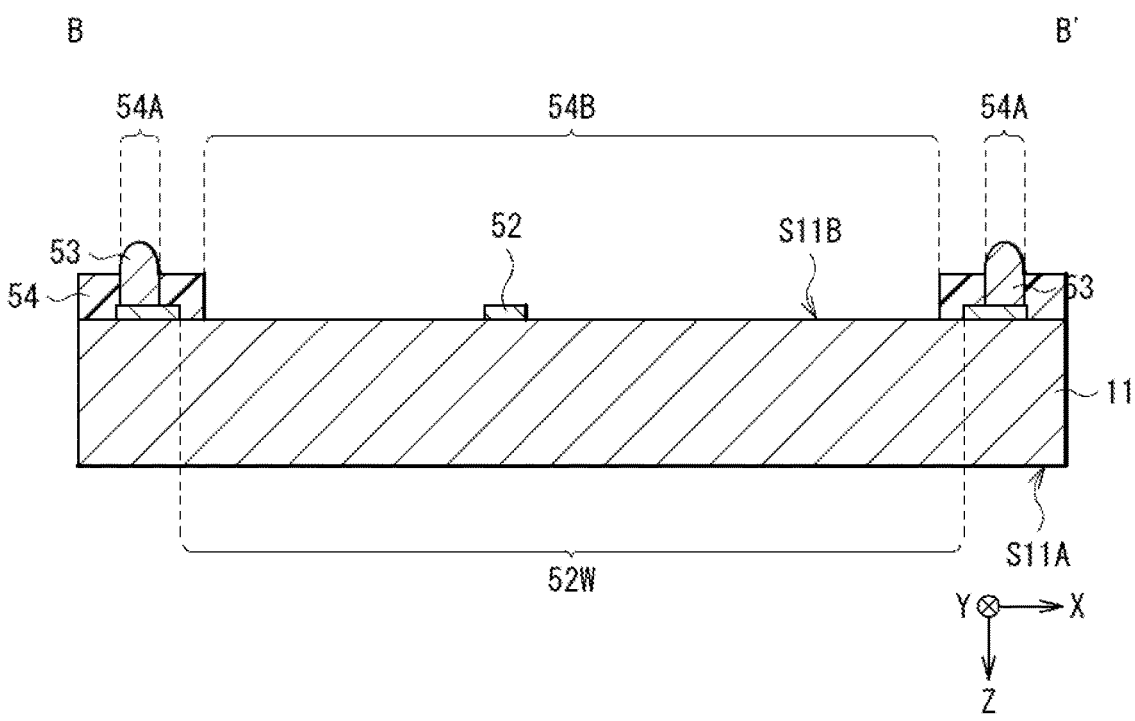
FIG. 9B is a schematic view of a cross-sectional configuration taken along a line B-B' illustrated in FIG. 9A.

FIGS. 9A and 9B illustrate a configuration of a main part of the imaging device 1 according to a modification example 2 of the above-described embodiment. FIG. 9A illustrates planar configurations of the semiconductor substrate 11 (the second surface S11B), the rewiring layer 52, the solder ball 53, and the protective resin layer 54, and FIG. 9B illustrates a cross-sectional configuration taken along a line B-B' illustrated in FIG. 9A. Here, the protective resin layer 54 is provided to surround the solder ball 53. Except for this point, the imaging device 1 according to the modification example 2 has a configuration similar to that of the imaging device 1 according to the above-described embodiment, and the workings and effects thereof are also similar.

The protective resin layer 54 has an annular planar shape. A plurality of annular protective resin layers 54 is provided on the second surface S11B of the semiconductor substrate 11. Of the second surface S11B of the semiconductor substrate 11, a region other than a region in which the protective resin layer 54 is provided is the external terminal coupling region 54A or the stress relaxation region 54B. For example, the external terminal coupling region 54A is provided inside each of the plurality of annular protective resin layers 54, and the stress relaxation region 54B is provided outside each of the plurality of annular protective resin layers 54.

Providing the protective resin layer 54 to surround the solder ball 53 makes it easy to form the solder ball 53 and the solder ball 53 at a precise position.

Figure 10:
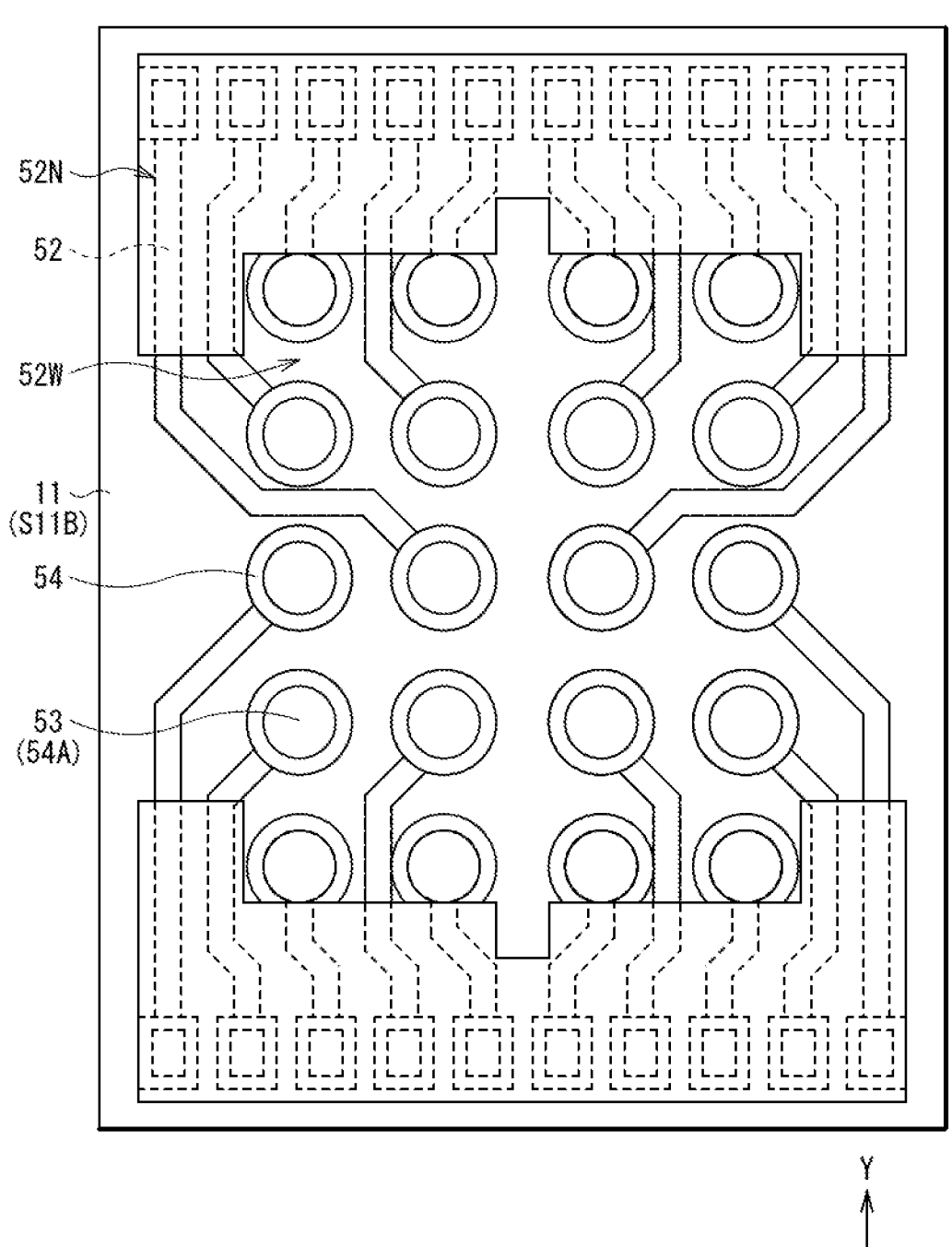
FIG. 10 is a schematic plan view of another example (1) of a configuration of a protective resin layer illustrated in FIG. 9A together with a rewiring layer and a solder ball.
Figure 11:
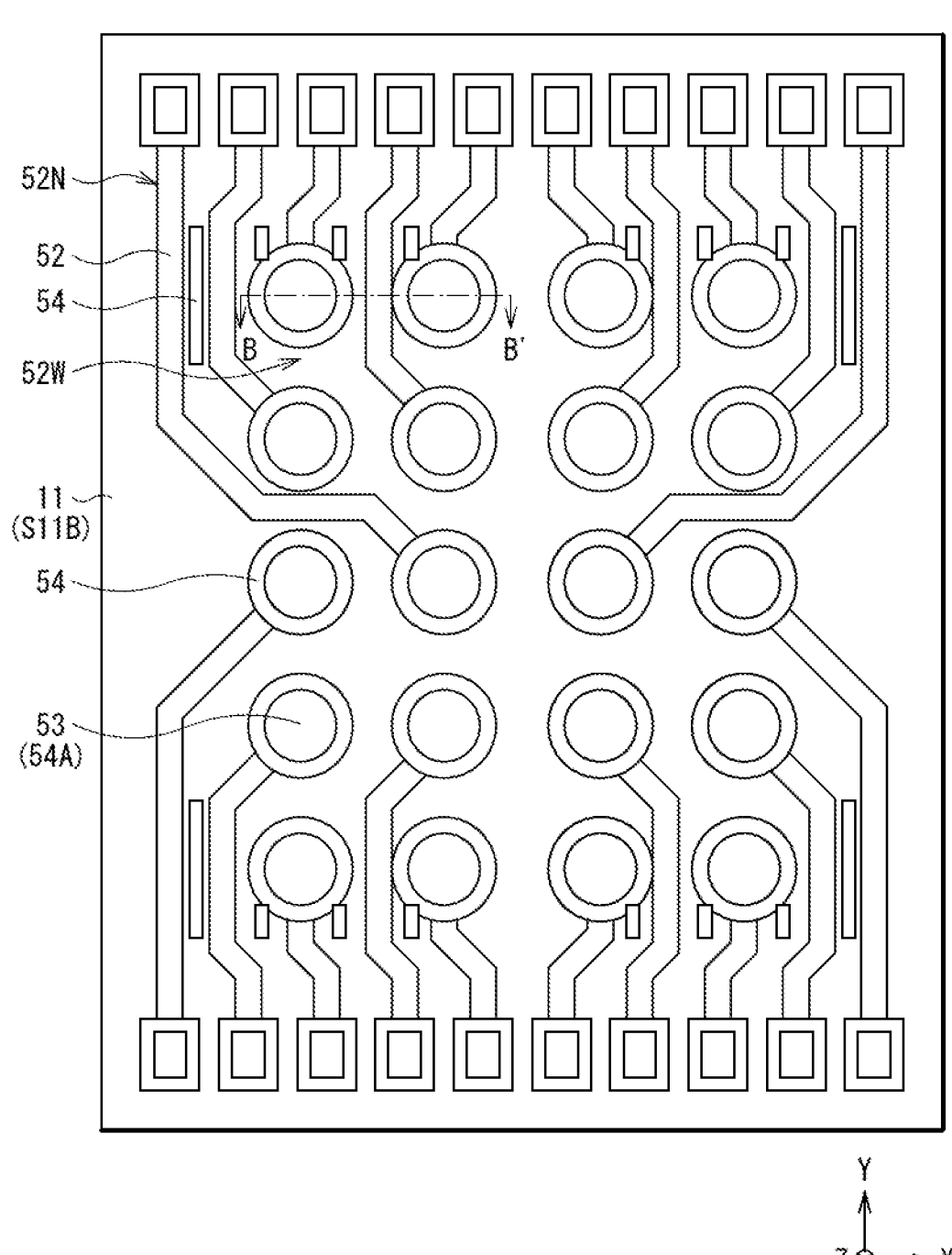
FIG. 11 is a schematic plan view of another example (2) of the configuration of the protective resin layer illustrated in FIG. 9A together with the rewiring layer and the solder ball.

FIGS. 10 and 11 illustrate another example of the configuration of the protective resin layer 54 illustrated in FIG. 9A.

As illustrated in FIG. 10, the configuration of the protective resin layer 54 described in the present modification example may be combined with the configuration of the protective resin layer 54 described in the above-described embodiment. Specifically, the protective resin layer 54 surrounding the solder ball 53 and the protective resin layer 54 at a position overlapping the narrow pitch region 52N may be provided on the second surface S11B of the semiconductor substrate 11. The stress relaxation region 54B is provided in a region outside the annular protective resin layer 54 and at a position overlapping the wide pitch region 52W.

As illustrated in FIG. 11, the configuration of the protective resin layer 54 described in the present modification example may be combined with the configuration of the protective resin layer 54 described the above-described modification example 1. Specifically, the protective resin layer 54 surrounding the solder ball 53 and the protective resin layer 54 disposed between the rewiring layers 52 adjacent to each other in the narrow pitch region 52N may be provided on the second surface S11B of the semiconductor substrate 11. The stress relaxation region 54B is provided in a region outside the annular protective resin layer 54 and at a position overlapping the wide pitch region 52W, and in a region outside the annular protective resin layer 54 and at a position overlapping the rewiring layer 52 in the narrow pitch region 52N.

Modification Example 3

Figure 12:
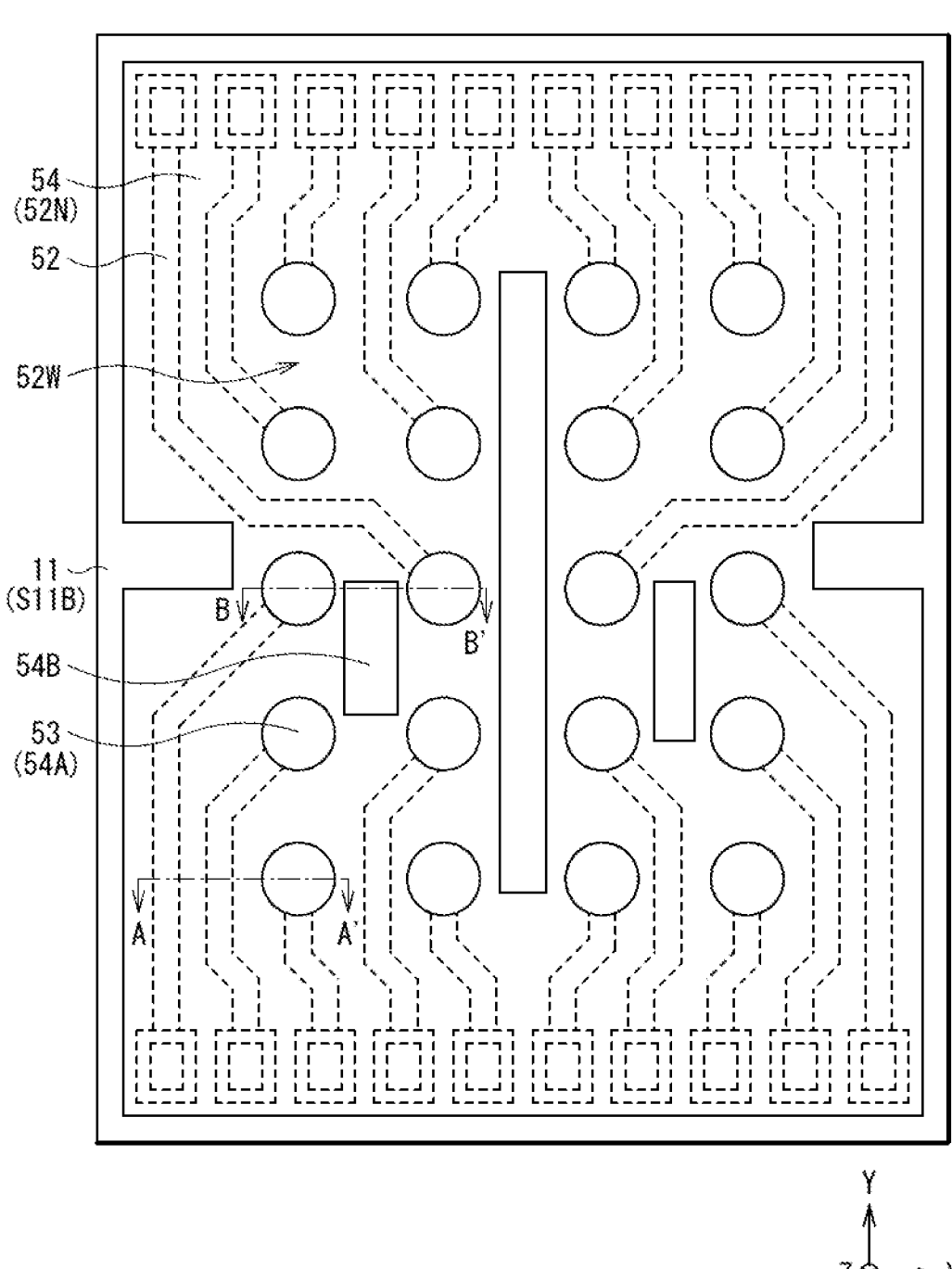
FIG. 12 is a schematic plan view of a configuration of a main part of an imaging device according to a modification example 3.

FIG. 12 schematically illustrates a planar configuration of a main part of the imaging device according to a modification example 3 of the above-described embodiment. Here, the stress relaxation region 54B is provided at a position not overlapping the rewiring layer 52. Except for this point, the imaging device 1 according to the modification example 3 has a configuration similar to that of the imaging device 1 according to the above-described embodiment, and the workings and effects thereof are also similar.

Figure 13A:
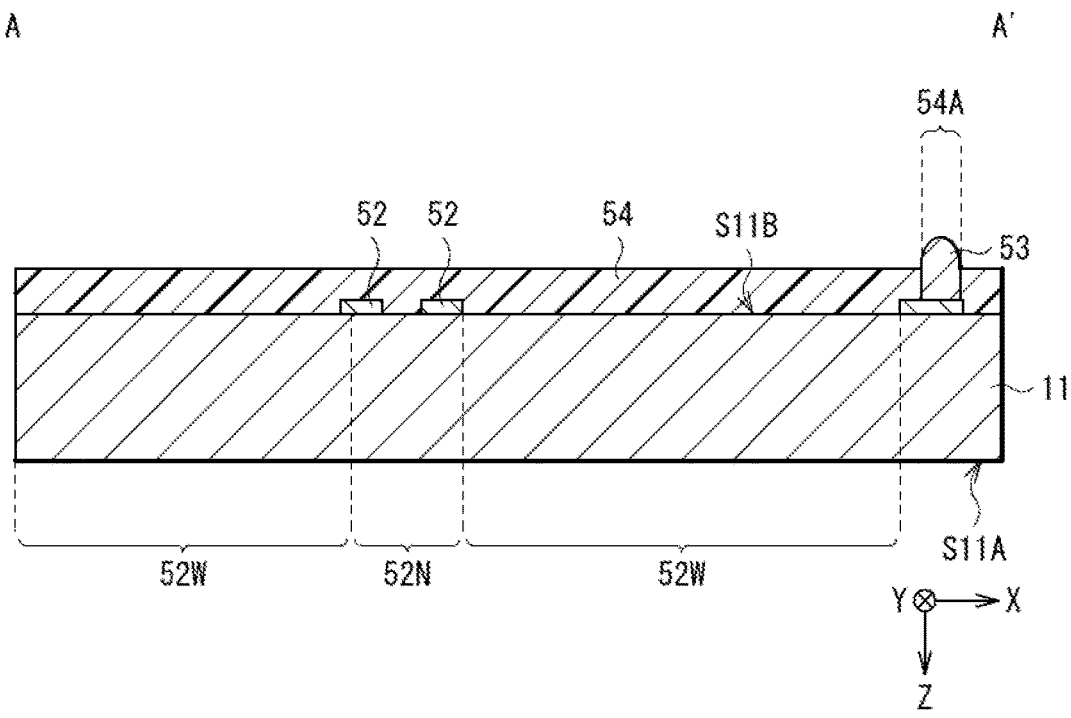
FIG. 13A is a schematic view of a cross-sectional configuration taken along a line A-A' illustrated in FIG. 12.
Figure 13B:
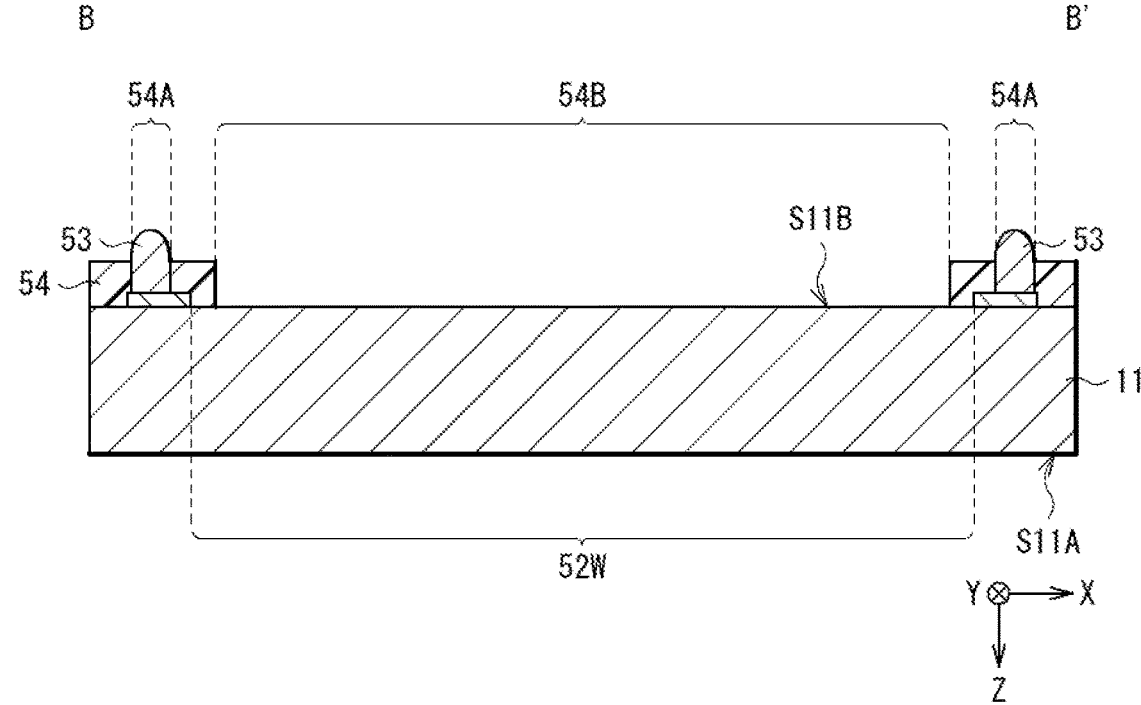
FIG. 13B is a schematic view of a cross-sectional configuration taken along a line B-B' illustrated in FIG. 12.

FIG. 13A illustrates a cross-sectional configuration taken along a line A-A' illustrated in FIG. 12, and FIG. 13B illustrates a cross-sectional configuration taken along a line B-B' illustrated in FIG. 12. For example, the protective resin layer 54 covers all the rewiring layers 52. The stress relaxation region 54B is provided, for example, at a position not overlapping the rewiring layers 52 in the wide pitch region 52W. The stress relaxation region 54B includes, for example, a slit of the protective resin layer 54.

The stress relaxation region 54B is provided at the position not overlapping the rewiring layers 52, thereby causing the protective resin layer 54 to protect the rewiring layers 52. This makes it possible to suppress occurrence of migration of the rewiring layers 52.

Modification Example 4

Figure 14:
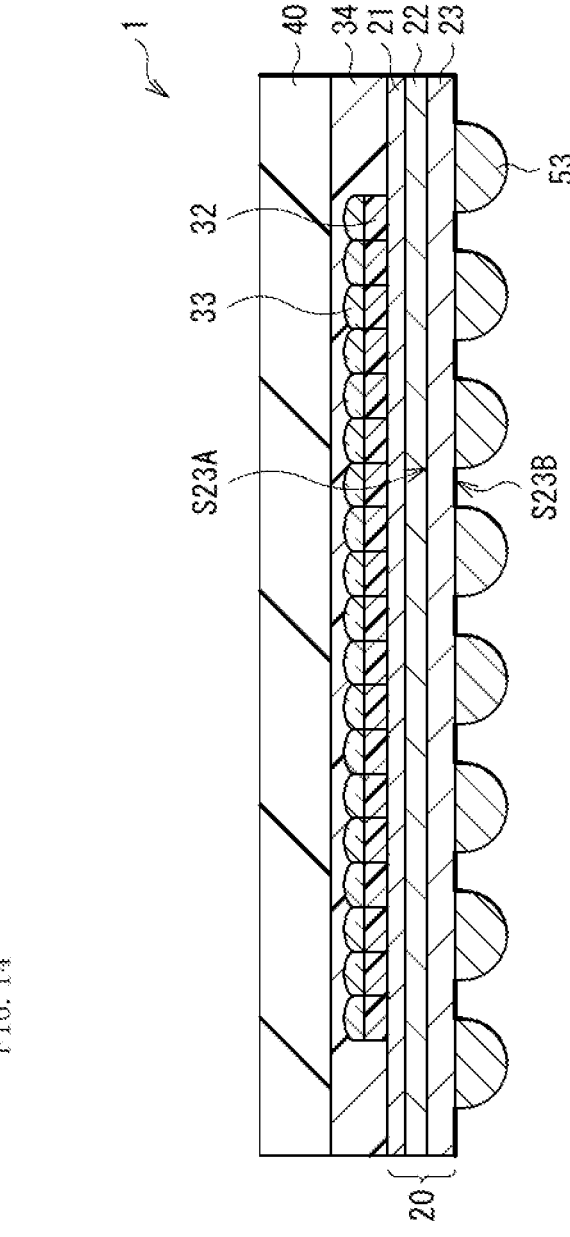
FIG. 14 is a schematic cross-sectional view of a configuration of a main part of an imaging device according to a modification example 4.

FIG. 14 schematically illustrates a cross-sectional configuration of a main part of the imaging device 1 according to a modification example 4 of the above-described embodiment. The imaging device 1 includes one chip (the sensor chip 20). That is, the imaging device 1 does not include a logic chip (the logic chip 10 in FIG. 2). Except for this point, the imaging device 1 according to the modification example 4 has a configuration similar to that of the imaging device 1 according to the above-described embodiment, and the workings and effects thereof are also similar.

The sensor chip 20 includes, for example, a supporting substrate 23, the multilayer wiring layer 22, and the semiconductor substrate 21 in this order. The supporting substrate 23 is opposed to the protection member 40 with the multilayer wiring layer 22 and the semiconductor substrate 21 interposed therebetween. The supporting substrate 23 has a first surface S23A on the semiconductor substrate 21 side and a second surface S23B opposed to the first surface S23A. The supporting substrate 23 includes, for example, a silicon (Si) substrate. The solder ball 53 and the like are provided on the second surface S23B of the supporting substrate 23. In the imaging device 1, the second surface S23B of the supporting substrate 23 has the external terminal coupling region 54A and the stress relaxation region 54B.

Modification Example 5

Figure 15:
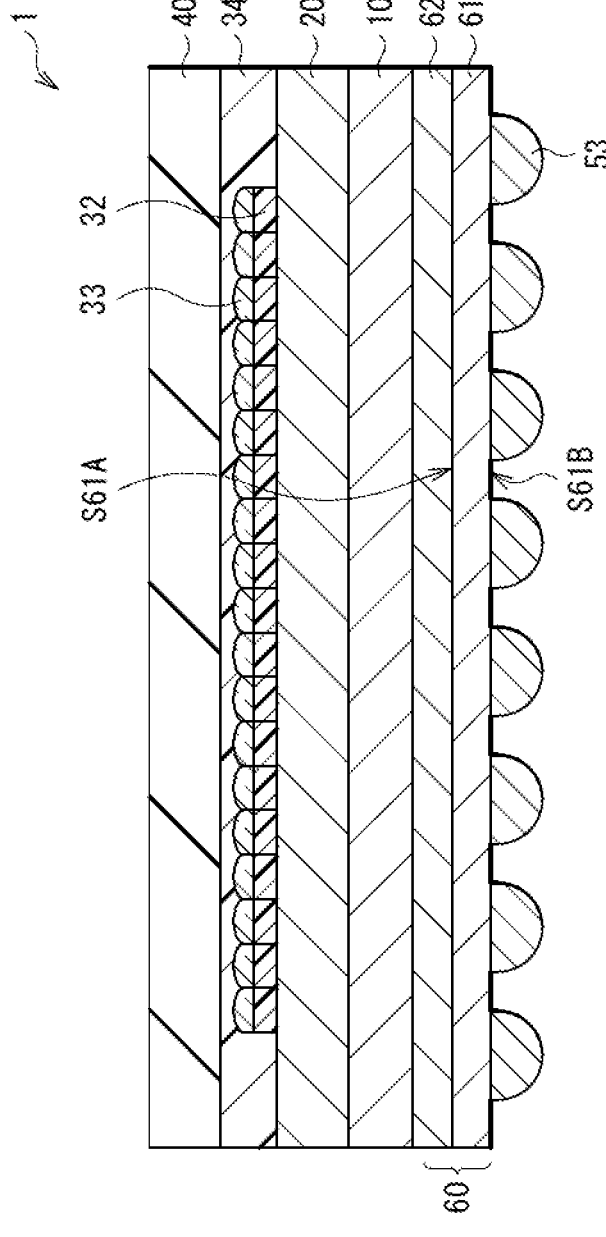
FIG. 15 is a schematic cross-sectional view of a configuration of a main part of an imaging device according to a modification example 5.

FIG. 15 schematically illustrates a cross-sectional configuration of a main part of the imaging device 1 according to a modification example 5 of the above-described embodiment. The imaging device 1 includes three chips (the logic chip 10, the sensor chip 20, and a memory chip 60). The imaging device 1 includes, for example, the memory chip 60 (a second chip), the logic chip 10 (a third chip), the sensor chip 20 (a first chip), and the protection member 40 in this order. Except for this point, the imaging device 1 according to the modification example 5 has a configuration similar to that of the imaging device 1 according to the above-described embodiment, and the workings and effects are also similar.

The memory chip 60 includes, for example, a memory circuit. The memory chip 60 is opposed to the protection member 40 with the logic chip 10 and the sensor chip 20 interposed therebetween. The memory chip 60 includes, for example, a multilayer wiring layer 62 and a semiconductor substrate 61 in this order from the logic chip 10 side. The semiconductor substrate 61 has a first surface S61A on the sensor chip 20 side and a second surface S61B opposed to the first surface S61A. The semiconductor substrate 61 includes, for example, a silicon (Si) substrate. The solder ball 53 and the like are provided on the second surface S61B of the semiconductor substrate 61. In the imaging device 1, the second surface S61B of the semiconductor substrate 61 has the external terminal coupling region 54A and the stress relaxation region 54B.

A logic chip including a logic circuit may be provided instead of the memory chip 60. That is, the imaging device 1 may include the sensor chip 20 and two logic chips.

Application Example

Figure 16:
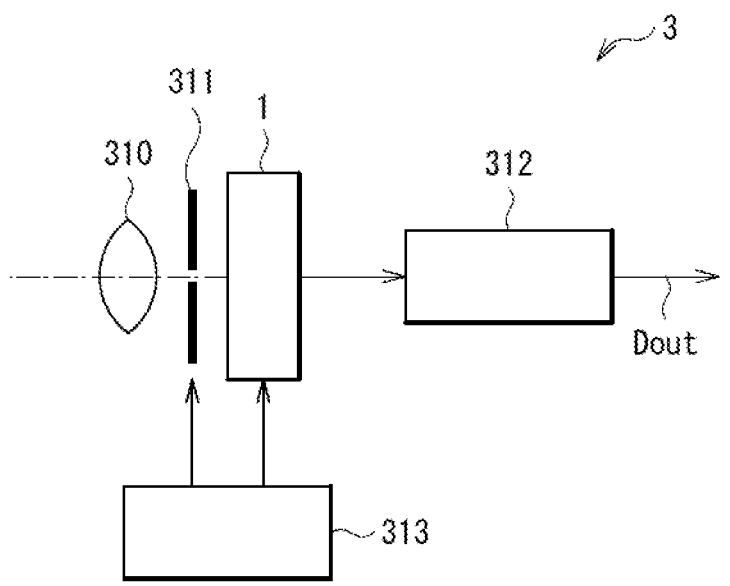

The above-described imaging device 1 is applicable, for example, to various types of electronic apparatuses such as a camera that is able to capture an image of light of a wavelength in a visible region. FIG. 16 illustrates a schematic configuration of an electronic apparatus 3 (a camera) as an example thereof. The electronic apparatus 3 is, for example, a camera that is able to shoot a still image or a moving image. The electronic apparatus 3 includes the imaging device 1, an optical system (an optical lens) 310, a shutter device 311, a driver 313 that drives the imaging device 1 and the shutter device 311, and a signal processor 312.

The optical system 310 guides image light (incident light) from a subject to the imaging device 1. The optical system 310 may include a plurality of optical lenses. The shutter device 311 controls a period in which the imaging device 1 is irradiated with light and a period in which the light is blocked. The driver 313 controls a transfer operation of the imaging device 1 and a shutter operation of the shutter device 311. The signal processor 312 performs various kinds of signal processing on a signal outputted from the imaging device 1. An image signal Dout having been subjected to the signal processing is stored in a storage medium such as a memory or outputted to a monitor or the like.

Example of Application to In-Vivo Information
Acquisition System

Further, the technology (present technology) according to the present disclosure is applicable to a variety of products. For example, the technology according to the present disclosure may be applied to an endoscopic surgery system.

Figure 17:
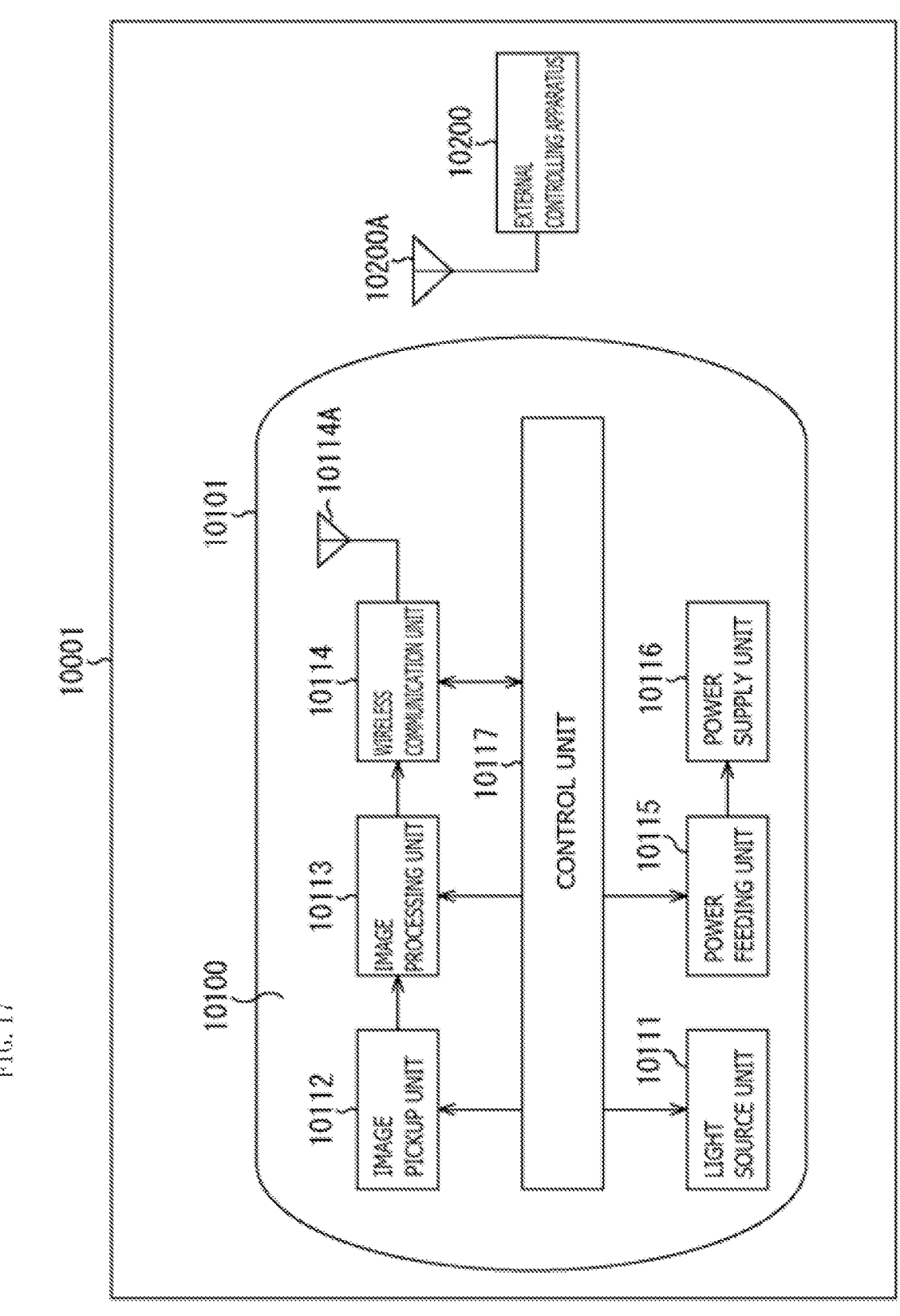
FIG. 17 is a block diagram depicting an example of a schematic configuration of an in-vivo information acquisition system.

FIG. 17 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 17, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

One example of the in-vivo information acquisition system to which the technology according to the present disclosure may be applied has been described above. The technology according to the present disclosure may be applied, for example, to the image pickup unit 10112 among the above-described components. This increases the detection accuracy.

Example of Application to Endoscopic Surgery System

The technology (present technology) according to the present disclosure is applicable to a variety of products. For example, the technology according to the present disclosure may be applied to an endoscopic surgery system.

15

Figure 18:
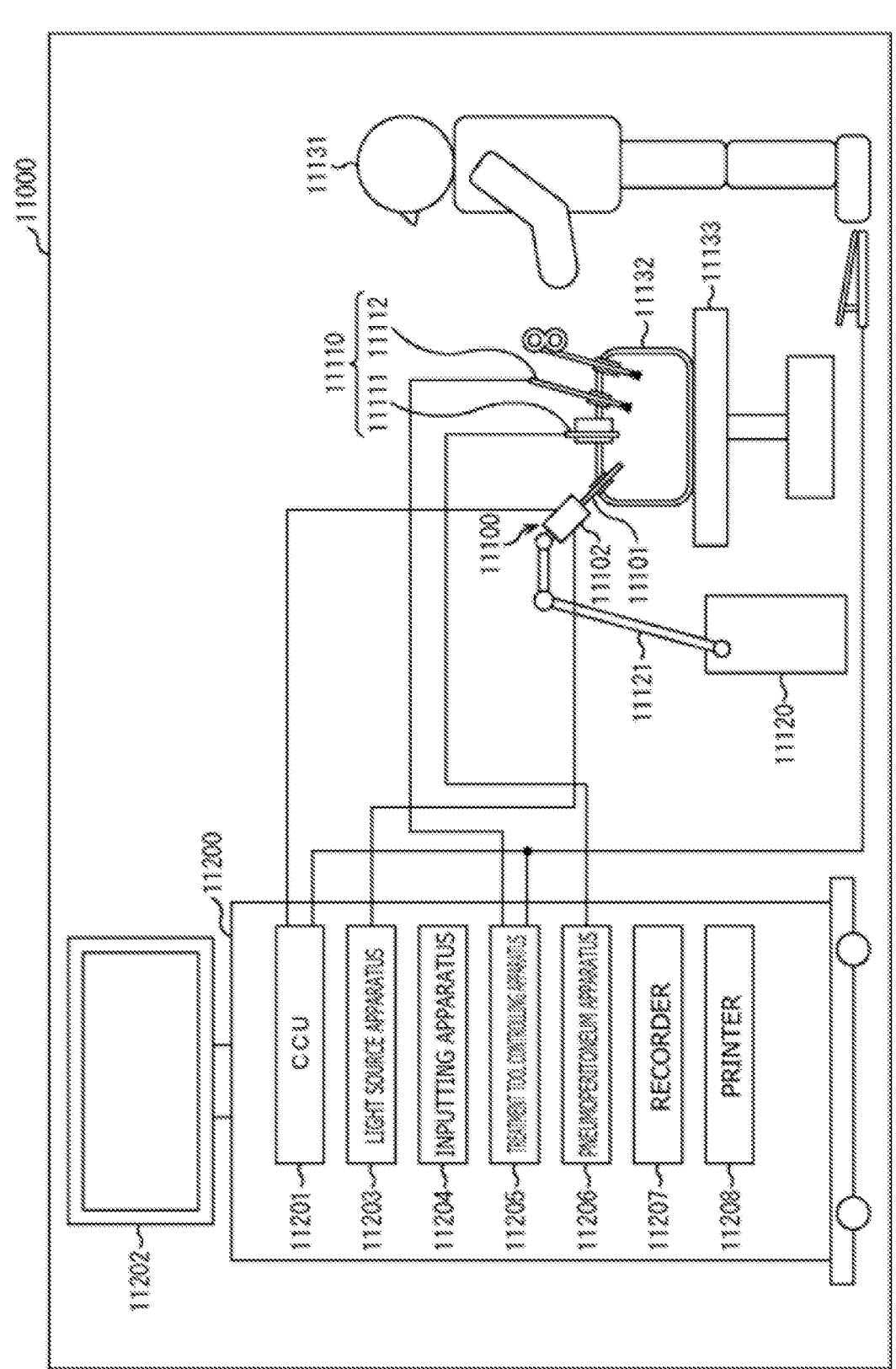
FIG. 18 is a view depicting an example of a schematic configuration of an endoscopic surgery system.

FIG. 18 is a view depicting an example of a schematic configuration of an endoscopic surgery system to which the technology according to an embodiment of the present disclosure (present technology) can be applied.

In FIG. 18, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 19:
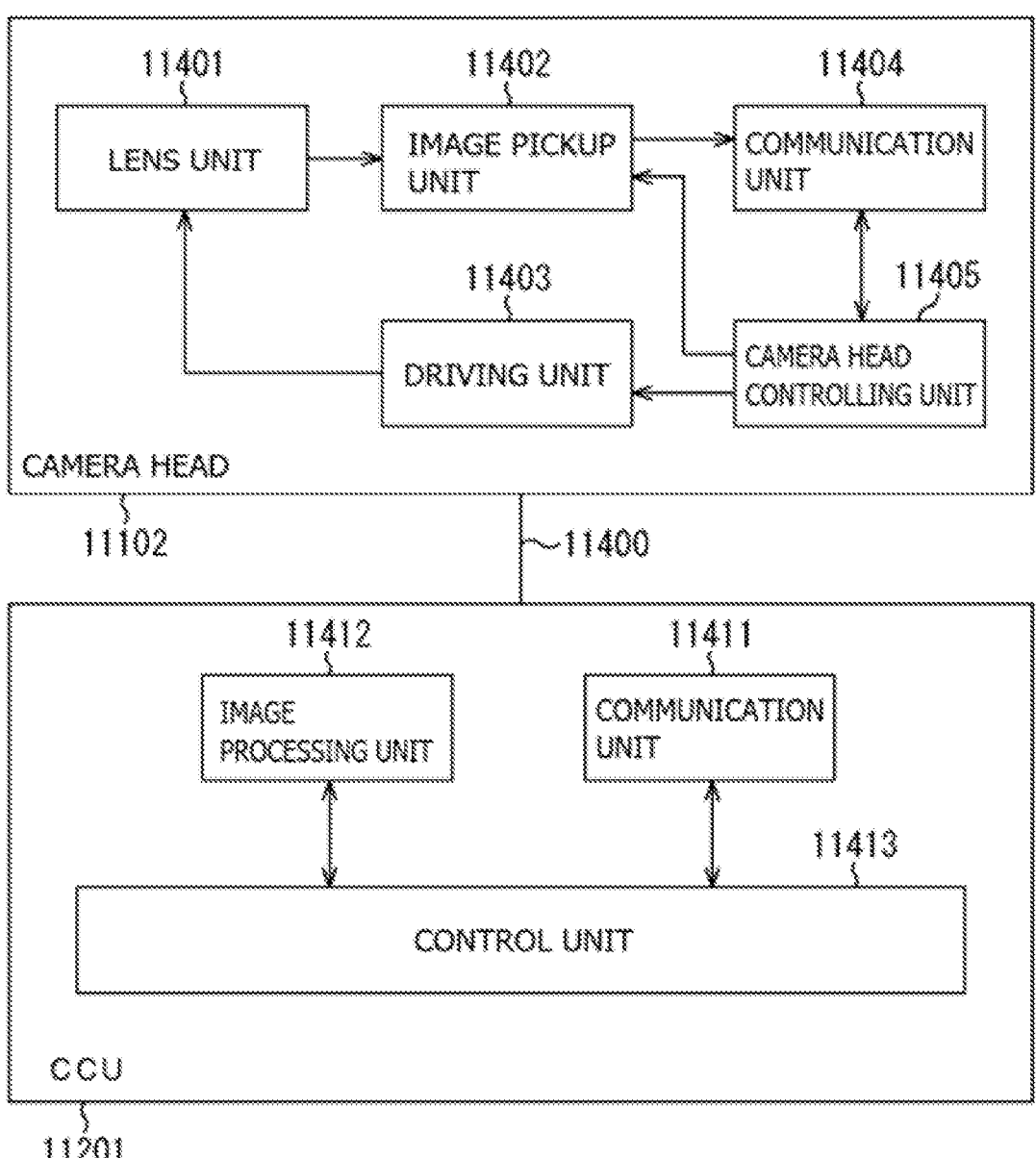
FIG. 19 is a block diagram depicting an example of a functional configuration of a camera head and a camera control unit (CCU).

FIG. 19 is a block diagram depicting an example of a functional configuration of the camera head 11102 and the CCU 11201 depicted in FIG. 18.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure may be applied has been described above. The technology according to the present disclosure may be applied to the image pickup unit 11402 among the above-described components. Applying the technology according to the present disclosure to the image pickup unit 11402 increases the detection accuracy.

It is to be noted that the endoscopic surgery system has been described here as an example, but the technology according to the present disclosure may be additionally applied, for example, to a microscopic surgery system or the like.

Example of Application to Mobile Body

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

Figure 20:
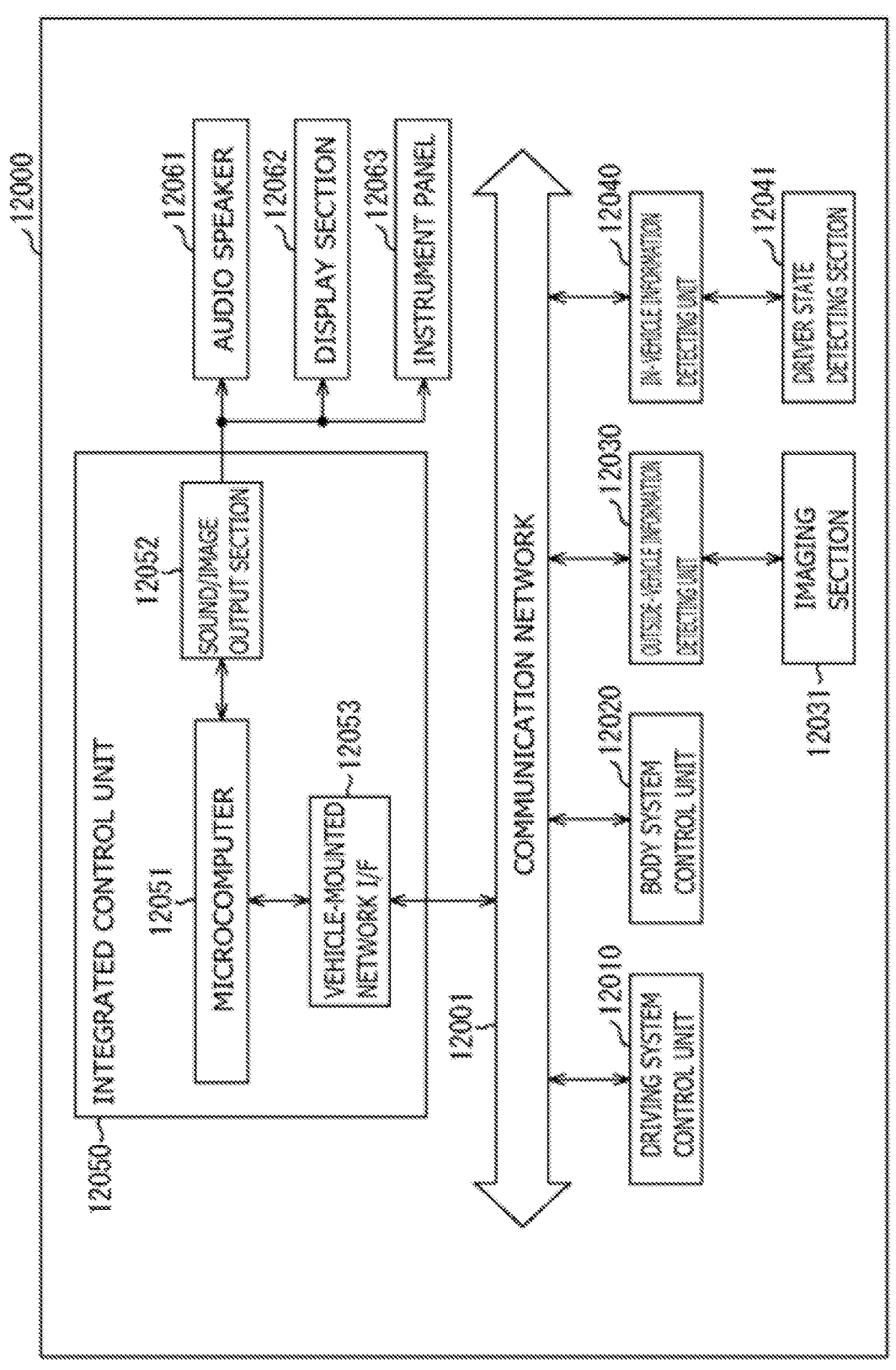
FIG. 20 is a block diagram depicting an example of schematic configuration of a vehicle control system.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

Figure 21:
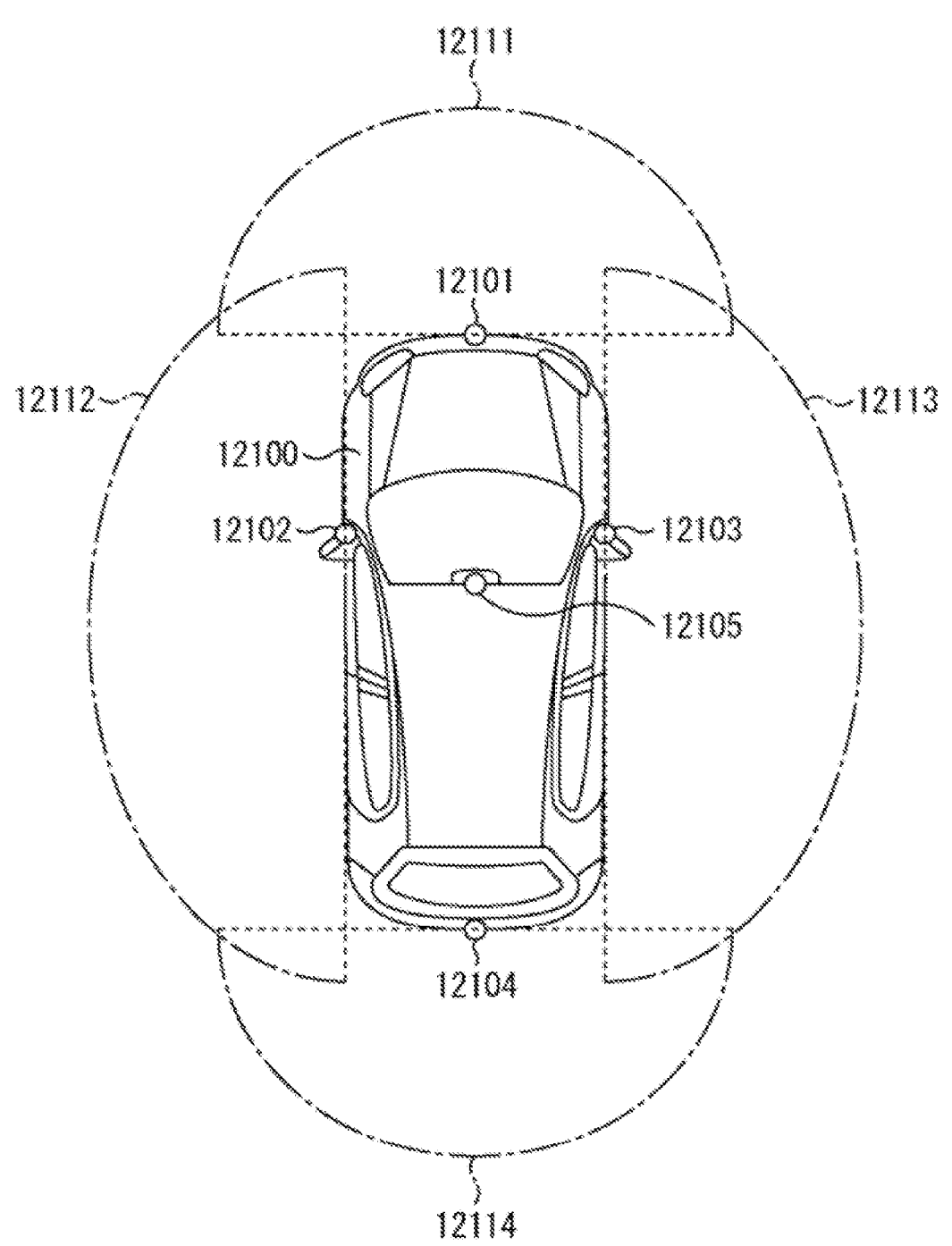
FIG. 21 is a diagram of assistance in explaining an example of installation positions of an outside-vehicle information detecting section and an imaging section.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure may be applied has been described above. The technology according to the present disclosure may be applied to the imaging section 12031 among the components described above. Applying the technology according to the present disclosure to the imaging section 12031 makes it possible to obtain a shot image that is easier to see. This makes it possible to decrease the fatigue of a driver.

The present disclosure has been described above with reference to the embodiment and the modification examples; however, the present disclosure contents are not limited to the embodiment and the like described above, and may be modified in a variety of ways. For example, the configuration of the imaging device in the embodiment described above are merely exemplary, and may further include any other layer. In addition, the materials and thicknesses of the respective layers are merely exemplary as well, and are not limited to those described above.

In addition, in the embodiment and the like described above, description has been given of examples of the configuration of the stress relaxation region 54B; however, the configuration of the stress relaxation region 54B is not limited to these examples.

In addition, in the embodiment and the like described above, description has been given of a case where the rewiring layer 52 is provided in the through hole 11V of the semiconductor substrate 11 (FIG. 2); however, the through hole 11V may be filled with an electrical conductor different from the rewiring layer 52, and the electrical conductor may be coupled to the rewiring layer 52.

In addition, in the embodiment and the like described above, description has been given of a case where the logic chip 10 and the sensor chip 20 are electrically coupled to each other by the through electrodes 223$a$ and 223$b$ (FIG. 2); however, the logic chip 10 and the sensor chip 20 may be electrically coupled to each other with use of another method. For example, the logic chip 10 and the sensor chip 20 may be electrically coupled to each other with use of metal direct bonding such as Cu—Cu bonding.

In addition, in the embodiment and the like described above, description has been given of an example in which the imaging device 1 includes a single chip (the sensor chip 20) (FIG. 14) and an example in which the imaging device 1 includes two or three stacked chips (the logic chip 10, the sensor chip 20, and the memory chip 60) (FIGS. 2 and 15). In addition to the examples, the imaging device 1 may include four or more stacked chips.

It is to be noted that the effects described in the embodiment and the like described above are merely exemplary, and may be any other effects or may further include any other effects.

It is to be noted that the present disclosure may have the following configurations.

(1)

An imaging device including:

a photoelectric converter;

a protection member provided on a light incidence side of the photoelectric converter;

a substrate opposed to the protection member with the photoelectric converter interposed therebetween and having a first surface on the photoelectric converter side and a second surface opposed to the first surface;

a rewiring layer provided in a selective region of the second surface of the substrate; and a protective resin layer provided on the second surface of the substrate, the second surface of the substrate having an external terminal coupling region exposed from the protective resin layer, and a stress relaxation region exposed from the protective resin layer and disposed at a position different from the external terminal coupling region.

(2)

The imaging device according to (1), further including an external terminal provided on the second surface of the substrate, in which in the external terminal coupling region, the external terminal is exposed from the protective resin layer.

(3)

The imaging device according to (2), in which the protective resin layer is provided to surround the external terminal.

(4)

The imaging device according to (3), in which, of the second surface of the substrate, a region other than a region in which the protective resin layer is provided to surround the external terminal includes the external terminal coupling region or the stress relaxation region.

(5)

The imaging device according to (1) or (2), in which the stress relaxation region is provided at a position not overlapping the rewiring layer.

(6)

The imaging device according to any one of (1) to (3), in which the second surface of the substrate further has a narrow pitch region in which the rewiring layers adjacent to each other are disposed at a predetermined interval, and a wide pitch region in which the rewiring layers adjacent to each other are disposed at an interval larger than the interval in the narrow pitch region.

(7)

The imaging device according to (6), in which the protective resin layer is provided in the narrow pitch region, and the stress relaxation region is disposed at a position overlapping the wide pitch region.

(8)

The imaging device according to (7), in which the protective resin layer is provided between the rewiring layers adjacent to each other in the narrow pitch region, and the stress relaxation region is also disposed at a position overlapping the rewiring layers in the narrow pitch region.

(9)

The imaging device according to any one of (1) to (8), further including:

a first chip provided with the photoelectric converter; and a second chip including the substrate.

(10)

The imaging device according to (9), further including a third chip provided between the first chip and the second chip.

(11)

The imaging device according to any one of (1) to (10), in which the rewiring layer includes copper.

(12)

The imaging device according to any one of (1) to (11), in which the substrate includes a silicon substrate.

This application claims the benefit of Japanese Priority Patent Application JP2018-114251 filed with Japan Patent Office on Jun. 15, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof

What is claimed is:

1. An imaging device, comprising:

a photoelectric converter;

a protection member provided on a light incident side of the photoelectric converter;

a substrate opposed to the protection member with the photoelectric converter interposed therebetween and having a first surface on the photoelectric converter side and a second surface opposed to the first surface;

a rewiring layer provided in a selective region of the second surface of the substrate; and a protective resin layer provided on the second surface of the substrate, wherein the second surface of the substrate has:

a first external terminal coupling region exposed from the protective resin layer, a second external terminal coupling region exposed from the protective resin layer, and a stress relaxation region exposed from the protective resin layer and disposed at a position different from the first external terminal coupling region, wherein the stress relaxation region includes the rewiring layer, and wherein the stress relaxation region is disposed between the first external terminal coupling region and the second external terminal coupling region.

2. The imaging device according to claim 1, further comprising a first external terminal provided on the second surface of the substrate, wherein, in the first external terminal coupling region, the first external terminal is exposed from the protective resin layer.

3. The imaging device according to claim 2, wherein the protective resin layer surrounds the first external terminal.

4. The imaging device according to claim 2, further comprising a second external terminal provided on the second surface of the substrate, wherein, in the second external terminal coupling region, the second external terminal is exposed from the protective resin layer.

5. The imaging device according to claim 4, wherein the protective resin layer surrounds the second external terminal.

6. The imaging device according to claim 5, wherein a region other than a region in which the protective resin layer is provided to surround the second external terminal includes the first and second external terminal coupling regions or the stress relaxation region.

7. The imaging device according to claim 1, wherein the stress relaxation region does not overlap the rewiring layer.

8. The imaging device according to claim 1, wherein the second surface of the substrate further has a narrow pitch region in which rewiring layers adjacent to each other are disposed at a predetermined interval, and a wide pitch region in which rewiring layers adjacent to each other are disposed at an interval larger than the interval in the narrow pitch region.

9. The imaging device according to claim 8, wherein the protective resin layer is provided in the narrow pitch region, and wherein the stress relaxation region is disposed at a position overlapping the wide pitch region.

10. The imaging device according to claim 9, wherein the protective resin layer is provided between the rewiring layers adjacent to each other in the narrow pitch region, and wherein the stress relaxation region is also disposed at a position overlapping the rewiring layers in the narrow pitch region.

11. The imaging device according to claim 1, further comprising:

a first chip provided with the photoelectric converter; and a second chip including the substrate.

12. The imaging device according to claim 11, further comprising a third chip provided between the first chip and the second chip.

13. The imaging device according to claim 1, wherein the rewiring layer includes copper.

14. The imaging device according to claim 1, wherein the substrate includes a silicon substrate.

* * * * *